(12) United States Patent
Summers et al.

(10) Patent No.: US 6,535,387 B2
(45) Date of Patent: Mar. 18, 2003

(54) HEAT TRANSFER APPARATUS

(75) Inventors: Mark D. Summers, Phoenix, AZ (US); Karl H. Mauritz, Chandler, AZ (US); Amber S. Bedi, Phoenix, AZ (US); William Handley, Chandler, AZ (US); Carol Miller, Gilbert, AZ (US); Javier Leija, Chandler, AZ (US); Daniel Dragoon, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/894,462

(22) Filed: Jun. 28, 2001

(65) Prior Publication Data

US 2003/0011993 A1 Jan. 16, 2003

(51) Int. Cl.⁷ .................................................. H05K 7/20
(52) U.S. Cl. ........................ 361/704; 361/707; 361/709; 361/710; 361/718; 361/719; 361/720; 361/721; 257/718; 257/719; 165/80.2; 165/80.3; 165/185
(58) Field of Search ................................ 361/702–704, 361/707, 710, 714, 715, 719, 720; 174/16.3, 252; 165/80.2, 80.3, 185; 257/706–727; 248/316.7

(56) References Cited

U.S. PATENT DOCUMENTS

| | | | | |
|---|---|---|---|---|
| 3,572,428 A | * | 3/1971 | Monaco ...................... 165/80.3 |
| 4,552,206 A | * | 11/1985 | Johnson et al. ............. 165/80.3 |
| 4,605,058 A | * | 8/1986 | Wilens ........................ 165/80.3 |
| 4,609,040 A | * | 9/1986 | Moore ......................... 165/80.3 |
| 4,945,401 A | * | 7/1990 | Trunk et al. ................. 257/718 |
| 5,184,281 A | | 2/1993 | Samarov ...................... 361/386 |
| 5,896,624 A | | 4/1999 | Horswell ...................... 24/67.5 |
| 6,104,612 A | * | 8/2000 | Holland ....................... 361/704 |
| 6,144,092 A | | 11/2000 | Kappes ........................ 257/718 |
| 6,219,905 B1 | * | 4/2001 | Bollesen ...................... 29/764 |
| 6,233,150 B1 | * | 5/2001 | Lin et al. ..................... 361/704 |

* cited by examiner

Primary Examiner—Boris Chervinsky
(74) Attorney, Agent, or Firm—Schwegman, Lundberg, Woessner & Kluth, P.A.

(57) ABSTRACT

The present invention relates generally to apparatus and methods for the spreading and dissipation of thermal energy from heat-producing components. More particularly, it relates to a heat transfer apparatus and methods particularly useful in the electrical arts. One embodiment of a heat transfer apparatus include but not limited to, a spring-biased member comprising a first side member, a second side member, and a connecting member adapted for spring-biased removable attachment to a heat-producing device. Another embodiment of a heat transfer apparatus is a spring-biased carrier that attaches to a heat-producing device and which carries a member, such as a finned plate. Another embodiment of a heat transfer apparatus is a spring-biased member comprising fingers for conducting thermal energy to a structure. Another embodiment of a heat transfer apparatus is a spring-biased clip used to attach separate heat-spreading/dissipating members, such as a finned plate, against a heat-producing member.

43 Claims, 20 Drawing Sheets

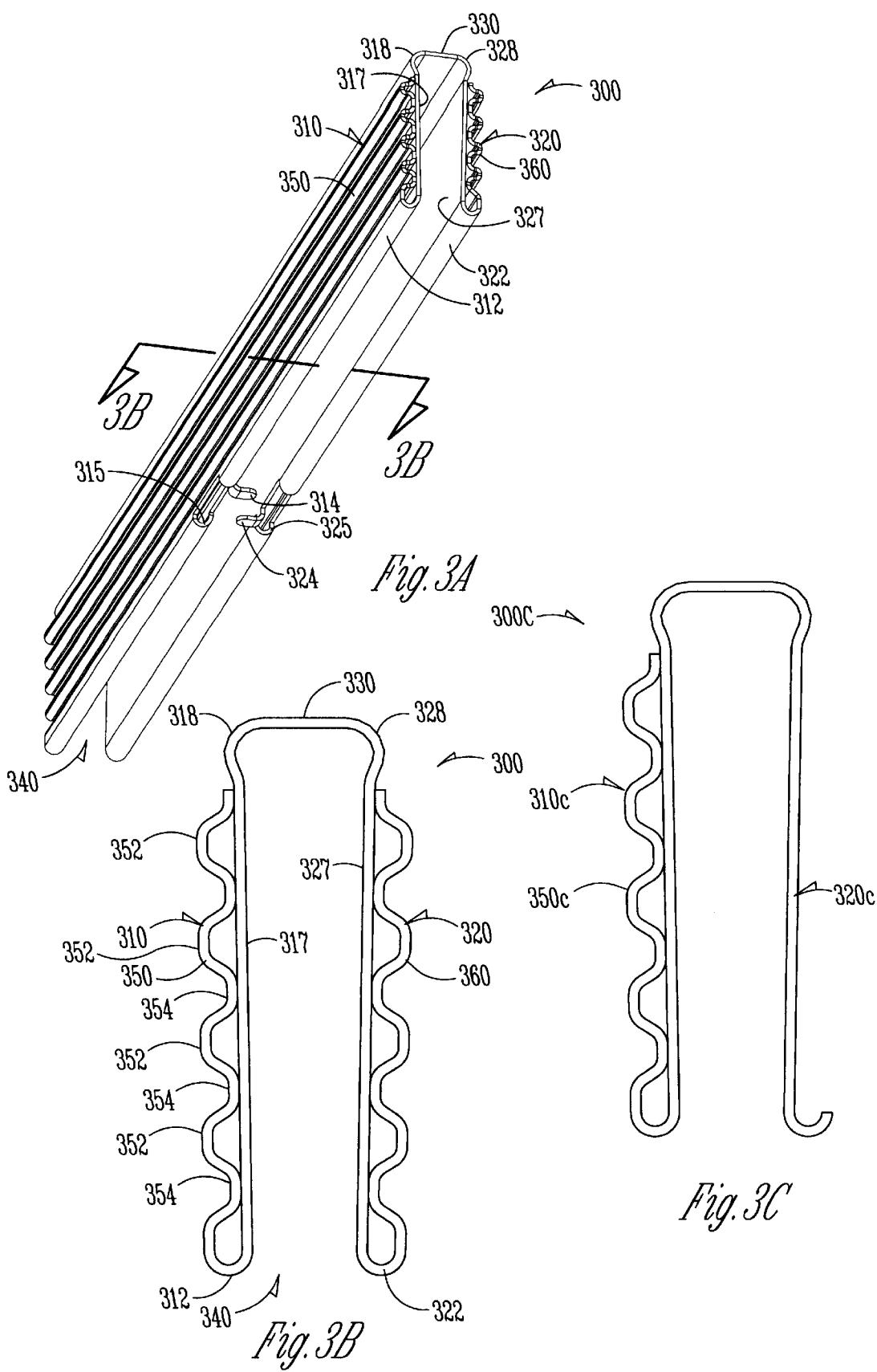

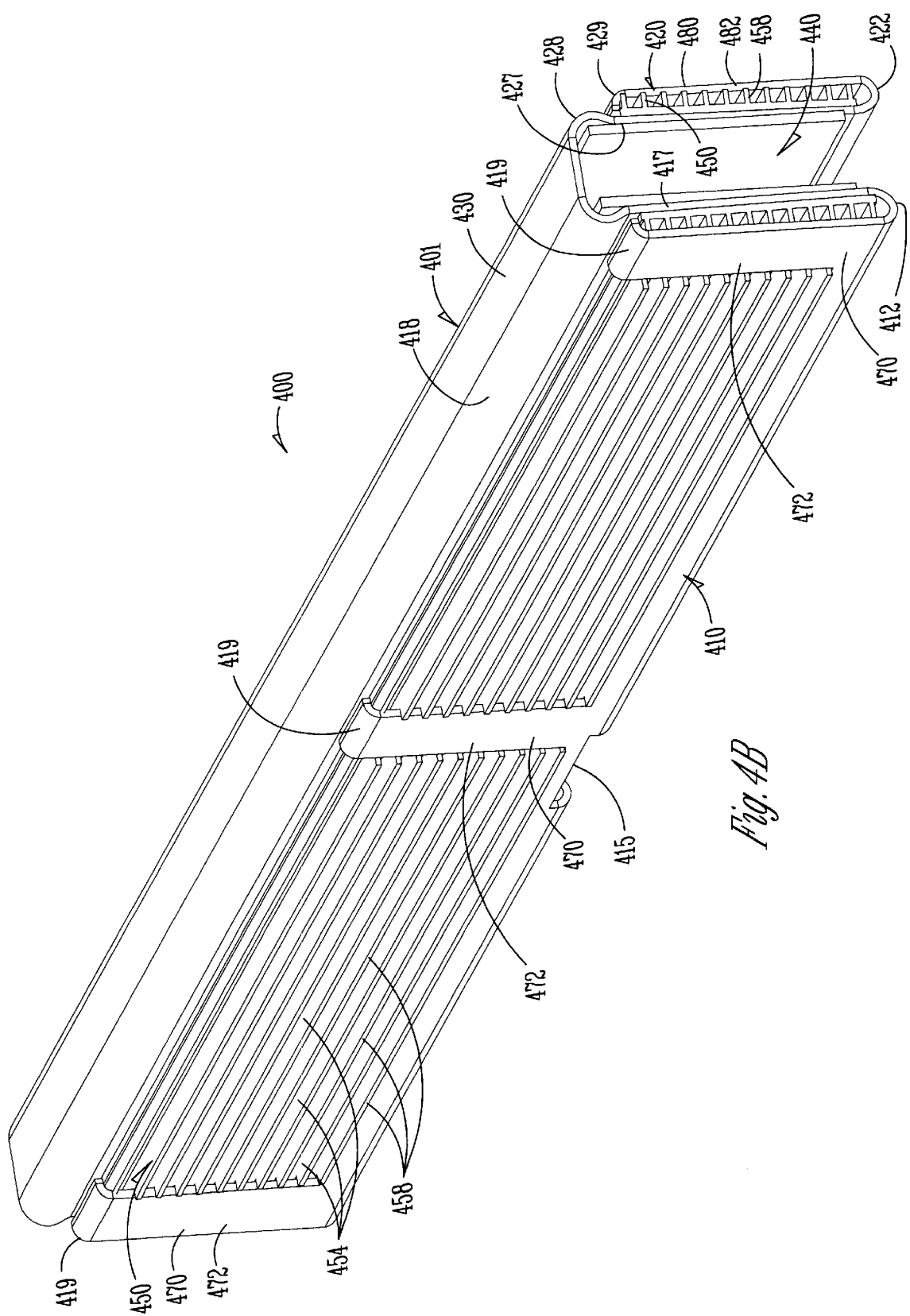

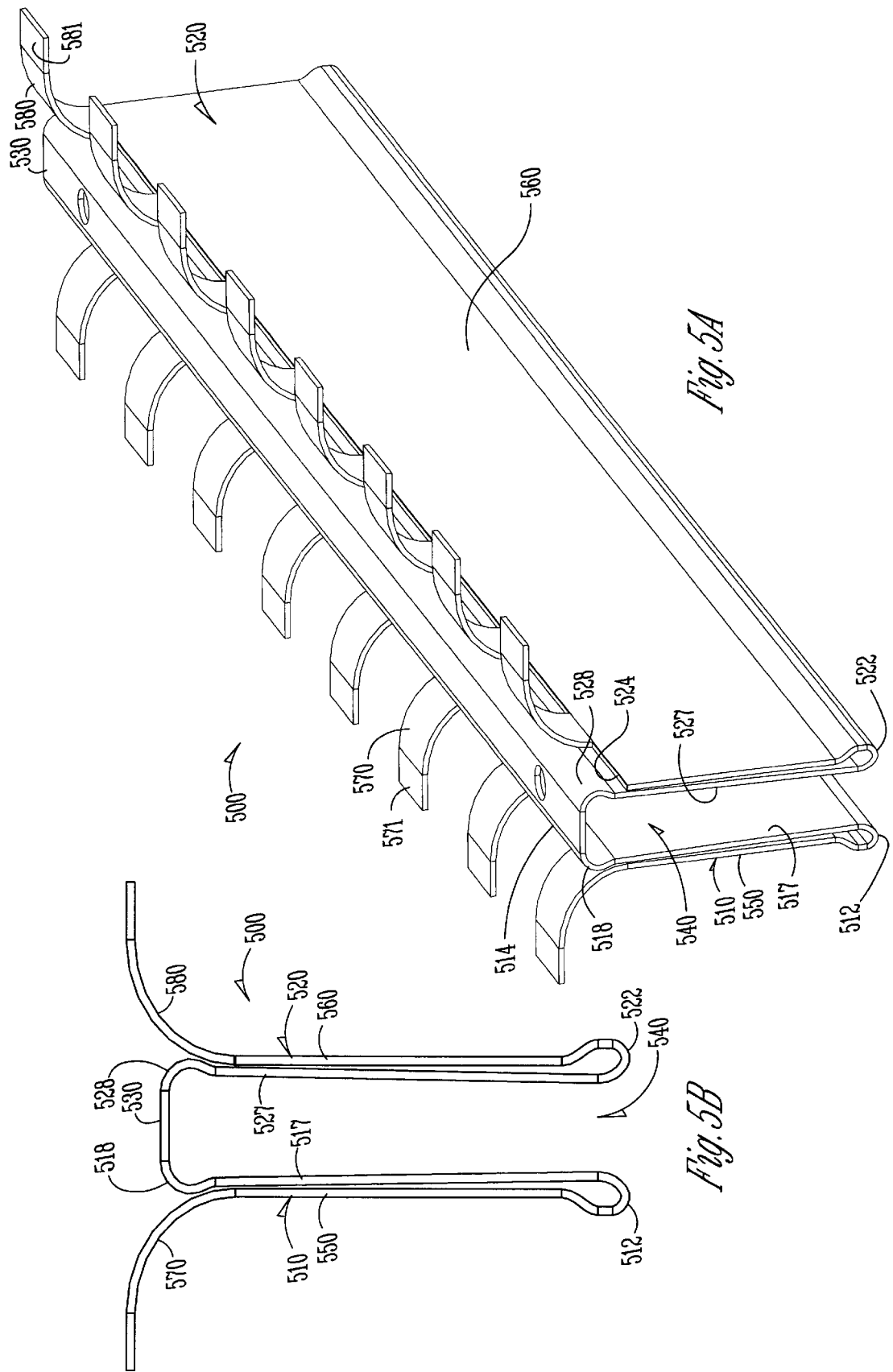

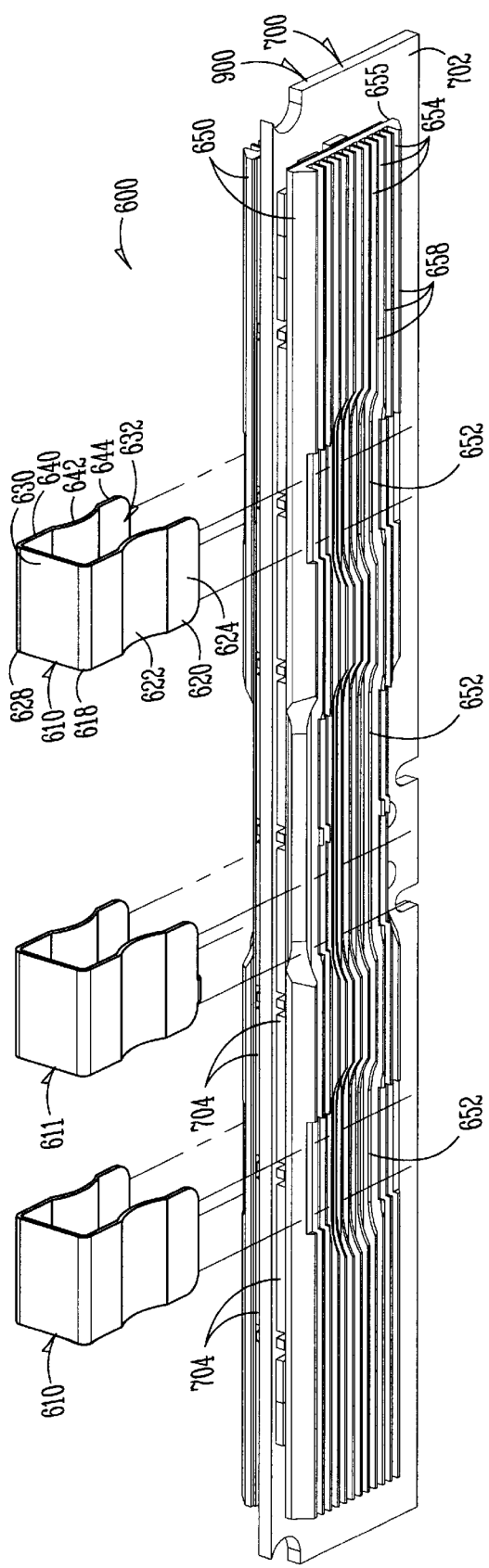
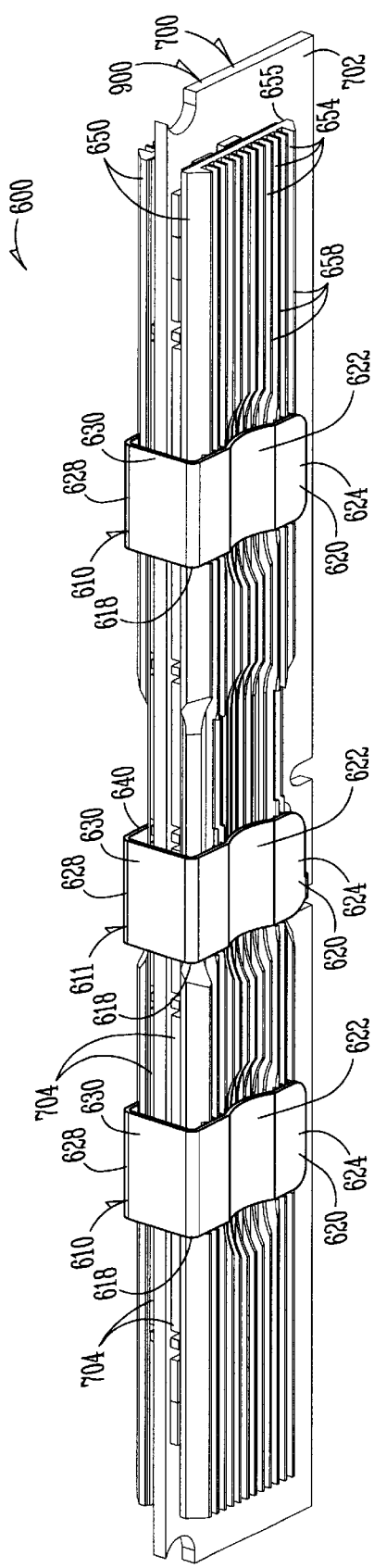
Fig. 6A
Fig. 6B

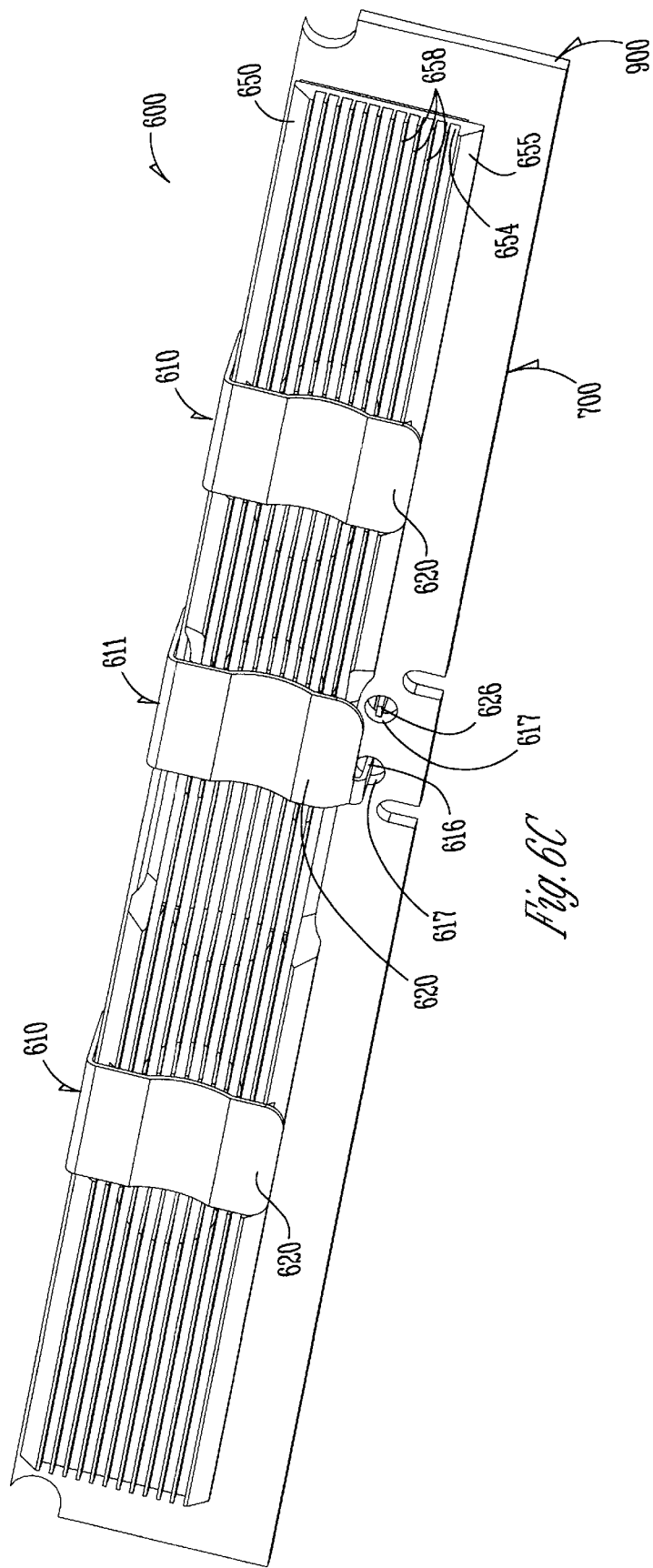

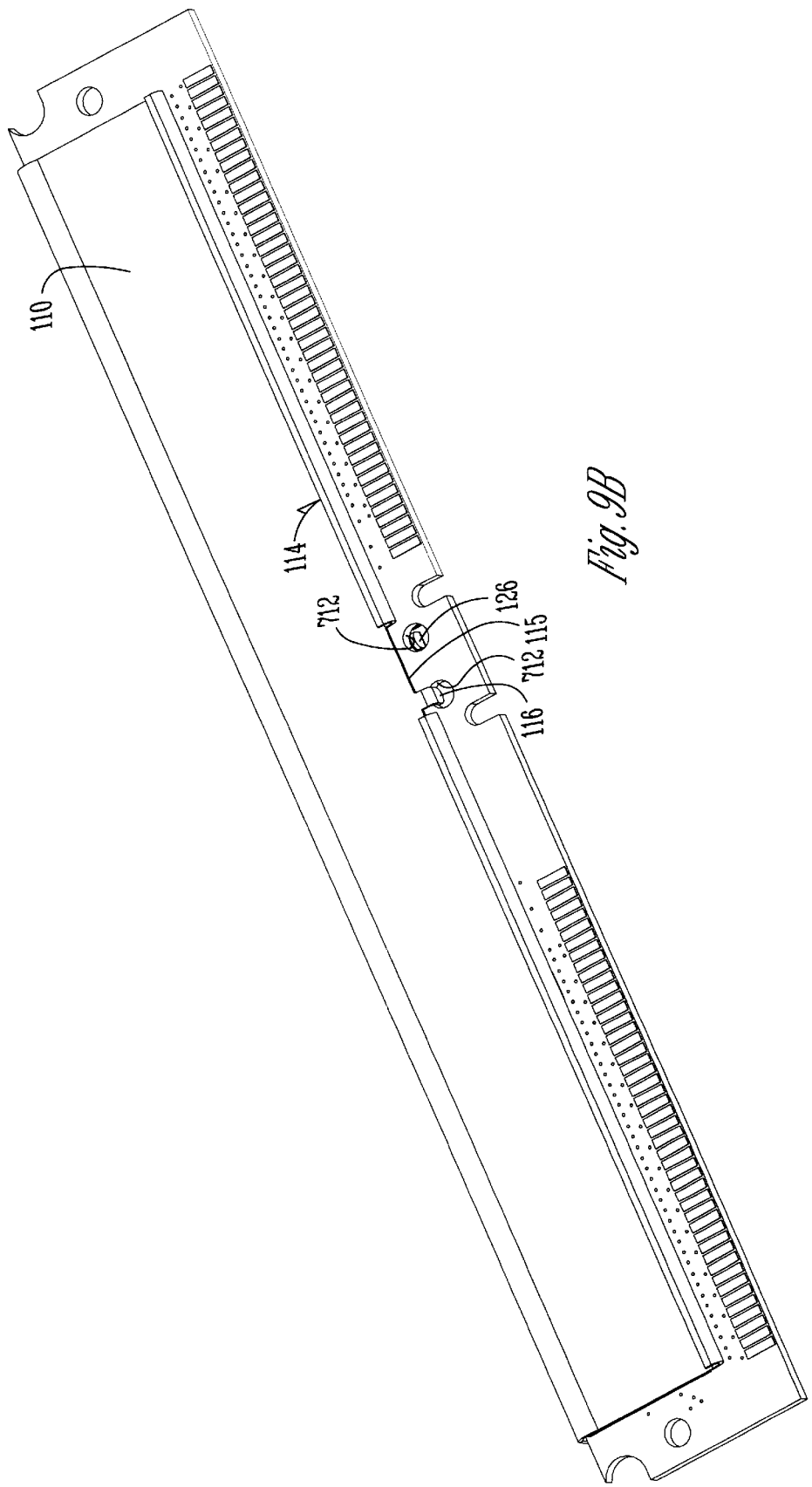

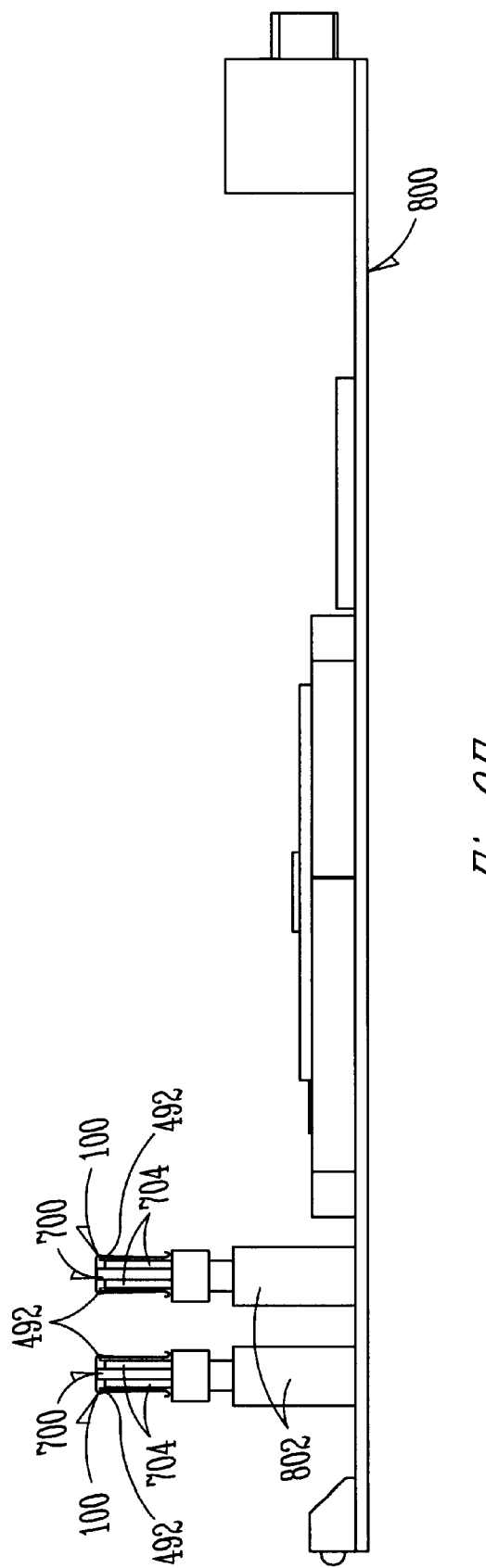

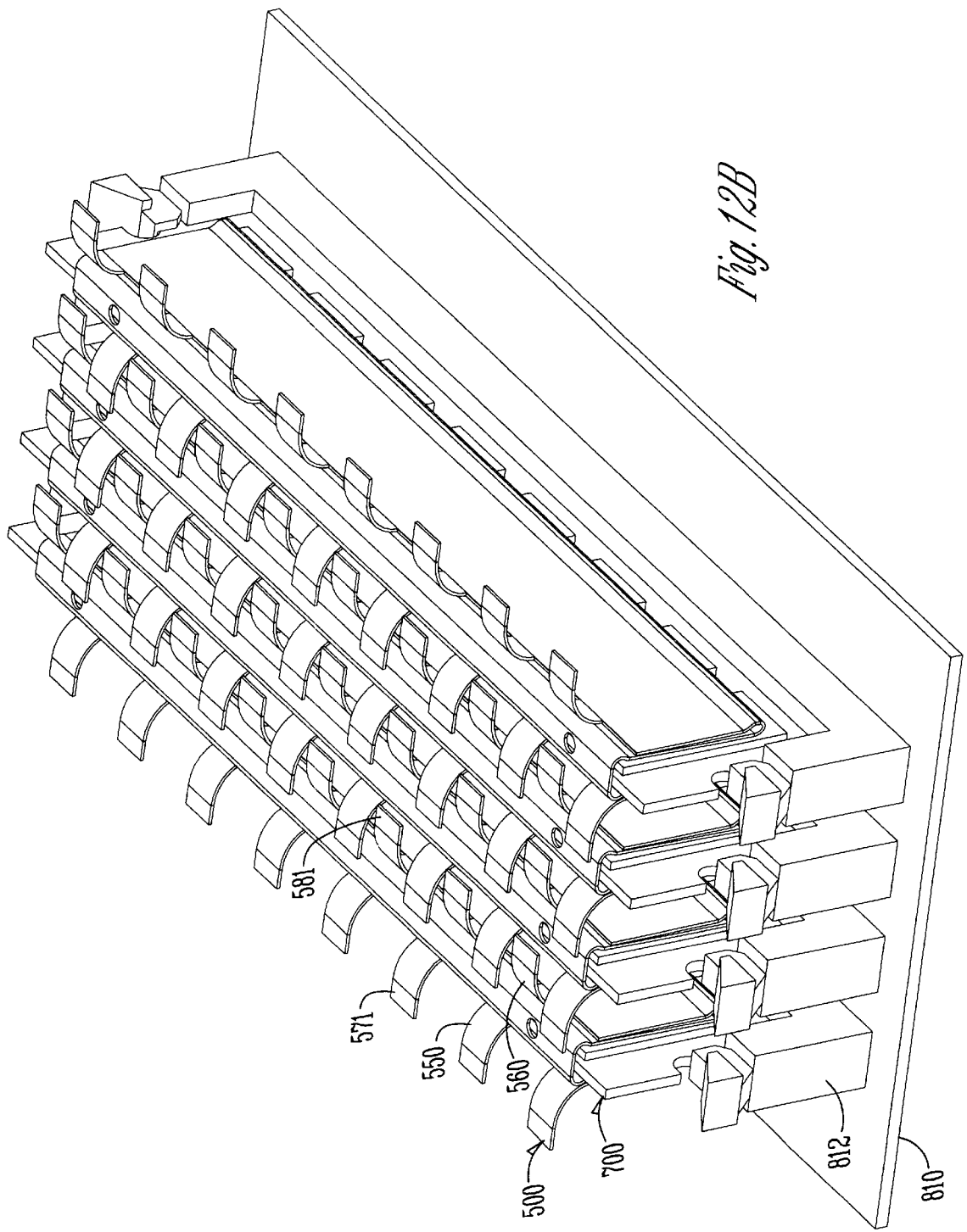

HEAT TRANSFER APPARATUS

FIELD

The present invention relates generally to apparatus and methods for the spreading and dissipation of thermal energy from heat-producing components. More particularly, it relates to a removable heat transfer apparatus and methods particularly useful in the electrical arts.

BACKGROUND

Many electronic components produce significant and potentially damaging levels of heat during operation. In certain cases, it is necessary to augment the dissipation of the heat from the components by the use of cooling apparatus. Heat management is especially critical in computer systems, not only to protect the heat-producing components from the effects of high temperatures, but also to protect surrounding components and structures. Considering that computer components are commonly housed in compact enclosures, heat management becomes increasingly important to maintain safe operating temperatures.

One computer component that generates significant levels of heat is the memory chip. Memory chips, such as random assess memory (RAM) chips, are electronic components that store data and instructions for processing by a central processing unit (CPU). Memory chips come in many different packaging configurations, but most share the general shape of a low profile rectangular box or plate.

In early computer design, memory chips were mounted directly to the computer motherboard, otherwise known as the mainboard. Today, memory chips are typically assembled into what is referred to as a memory module. There are three major components that make up a memory module: the memory chips, a printed circuit board (PCB), and other "on-board" elements such as resistors and capacitors. Memory modules have one or more mating electrical contacts that couple with one or more sockets attached to the motherboard. Memory modules stand upright and away from the motherboard either at an angle or perpendicular to the motherboard surface. This allows for the attachment of many more memory chips than would be permitted if each chip were mounted directly to the motherboard. Memory modules also permit easy and rapid assembly/disassembly to the motherboard.

Commonly, more than one memory chip is mounted onto the PCB that makes up the memory module. Memory chips may be mounted on only one side of the PCB or on both sides. The memory chips are mounted such that they lie flat against the PCB. Memory chips come in a variety of sizes and shapes, but commonly, only memory chips of one type are used for each type of memory module. Since the same type of chip is used on a particular memory module, the mounted chips extend substantially the same distance above the surface of the PCB.

Therefore, the back surface of one memory chip is substantially coplanar with adjacent chips on the same side of the PCB, the significance of which will be discussed below.

Advancements in memory components continuously focus on increased access speed and larger storage capacity in a smaller package. Inevitably, these advancements come in the form of memory chips that contain more circuits operating at higher speeds and mounted on smaller boards. In some types of memory modules, all of the memory chips on the PCB operate at substantially the same wattage and access rates such that the chips generate substantially the same heat. The chips on more advanced memory modules may operate at different wattage and at different access rates such that each chip produces different levels of heat at different times. The dissipation of excess heat becomes even more challenging as memory modules become faster and smaller.

In certain memory module configurations, especially for memory modules where one chip produces a different localized heat output as an adjacent chip, it is advantageous to manage this heat by spreading the heat over the entire memory module using a heat transfer apparatus. A common heat transfer apparatus used in the art is sheet metal which is placed overtop the backs of the memory chips and riveted to the PCB via holes in the board. Since that same type of chip is used on specific types of memory modules, the back surface of the chips on one side of the memory module are substantially coplanar. Therefore, a substantially flat piece of sheet metal will contact the back surface of all of the memory chips on a particular side of the memory module. If memory chips are mounted on both sides of the memory module, a second piece of sheet metal is used in similar fashion. The sheet metal acts to spread or distribute the heat produced by the chips over all of the chips on a particular side of the memory module resulting in a substantially even distribution of heat among the memory chips. The sheet metal also augments the dissipation of heat produced by the chips by exposing a larger surface to the environment.

There are drawbacks to the current heat transfer apparatus devices. The current heat transfer apparatuses require riveting the sheet metal to the PCB card. This requires that a number of holes be incorporated on the PCB card, which, among other things, takes up valuable space on the PCB card that could be used for other electrical components. Further, it is very difficult to access or replace the memory chips from the PCB once the sheet metal is riveted in place. Also, it is very difficult to reposition the heat transfer apparatus, for example during manufacturing, once riveting takes place. Further, uneven stress at the rivet locations may lead to an uneven contact between the chips and the sheet metal and unsatisfactory structural properties.

Another drawback of the present art involves the constant striving for component miniaturization present in the computer art. It is desired that the size of the memory module be made smaller yet retain the same or more memory capacity. Therefore, as the PCB card is made smaller while comprising the same number of memory chips, there is less room for a full compliment of mounting holes available for mounting the heat transfer apparatus as is available in a standard height memory card. Hence, a standard heat transfer apparatus can not be ideally utilized on shorter memory modules.

In addition, the present heat transfer apparatus is limited in its ability to act as a heat sink to dissipate the thermal energy to its environment. Further improvements are needed to improve the heat dissipation while retaining a compact size as well as to provide for disassembly.

Accordingly, there is a need for improved heat transfer apparatus and methods that address these and other shortcomings of the current art.

BRIEF DESCRIPTION OF THE DRAWINGS

FIGS. 3A, 3B, and 3C are perspective, side, and end views, respectively, of an embodiment of a heat transfer apparatus.

FIGS. 4A and 4B are exploded and perspective views, respectively, of an embodiment of a heat transfer apparatus.

FIGS. 5A and 5B are perspective and side views, respectively, of an embodiment of a heat transfer apparatus.

FIGS. 6A, 6B and 6C are exploded and perspective views, respectively, of an embodiment of a heat transfer apparatus.

FIGS. 9A–9C are perspective views of an embodiment of a heat transfer apparatus coupled to a RH-DIMM.

FIG. 9E is a side view of an embodiment of a plurality of heat transfer apparatuses coupled to two RH-DIMMs which themselves are coupled to a substrate suitable for use in a computer system.

FIGS. 12B and 12C are perspective views of an embodiment of a plurality of heat transfer apparatuses coupled to a plurality of RH-DIMMs.

DETAILED DESCRIPTION

Figures 1A, 1B:
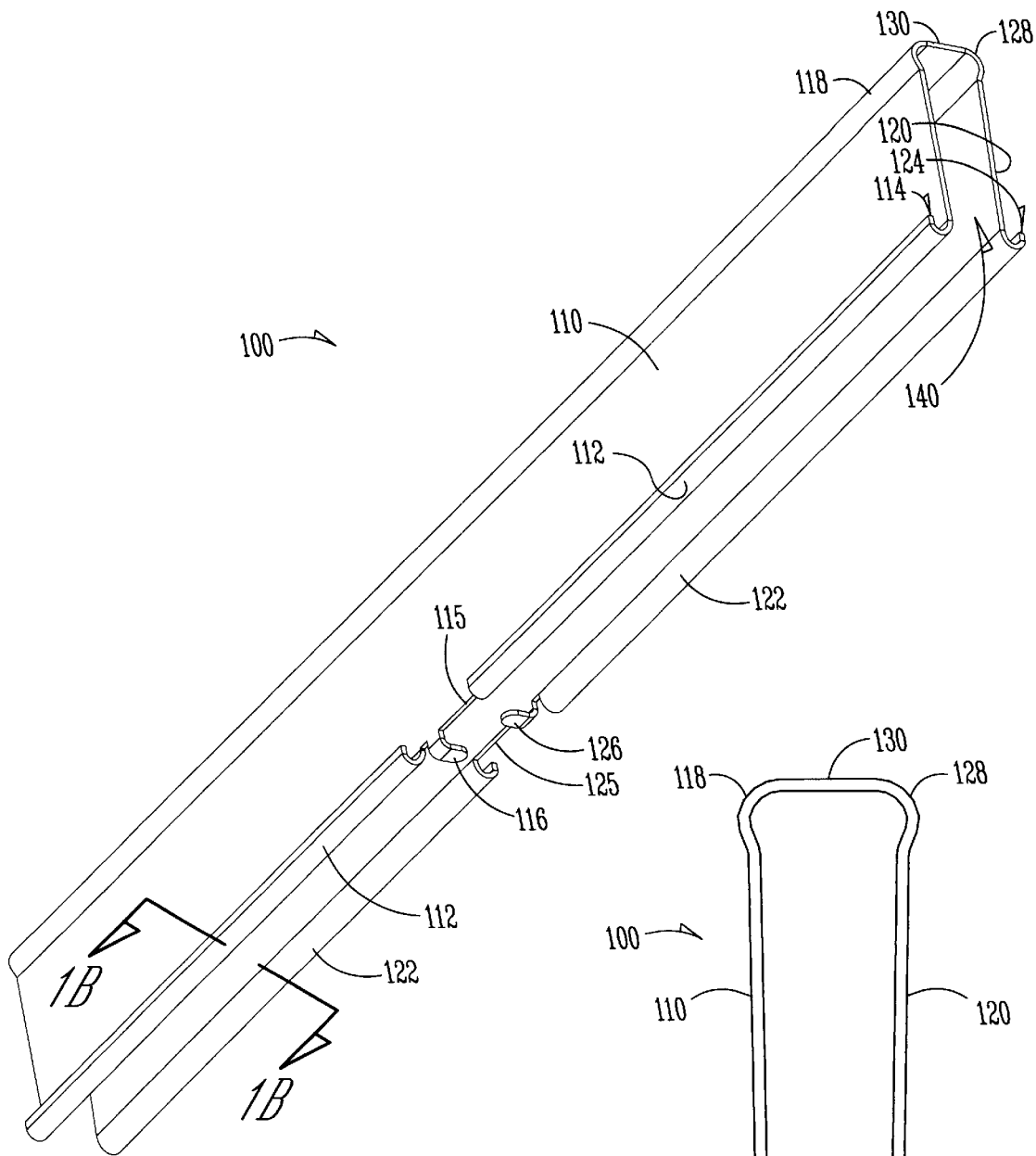
FIGS. 1A and 1B are perspective and cross-sectional views, respectively, of an embodiment of a heat transfer apparatus.

In the following detailed description, reference is made to the accompanying drawings, which are not necessarily to scale, which form a part hereof, and in which is shown, by way of illustration, specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

The following figures refer to apparatus and methods for a heat transfer apparatus adapted to be used on an electronic device, for example, a memory module, such as a random access memory (RAM) module, also referred to as a memory card, as might be used in, but not limited to, a personal computer (PC). The scope of the invention is not to be limited to memory modules specifically nor computer assemblies in general. The scope of the invention includes, but is not limited to, any device or apparatus requiring the benefits of a heat transfer apparatus.

FIG. 1A is a perspective view of an embodiment of a heat transfer apparatus 100. FIG. 1B is a cross-sectional view about the line 1B—1B of the same embodiment. The heat transfer apparatus 100 comprises a first side member 110, a second side member 120 and a connecting member 130. The connecting member 130 couples with the first and second side members 110, 120 at a first edge 118 and a second edge 128, respectively. The first and second side members 110, 120 further comprise a first and second free edge 114, 124 opposite the first and second edges 118, 128.

The heat transfer apparatus 100 is generally rectangular in cross section as shown in FIG. 1B. In one embodiment, the first and second side members 110, 120 are substantially planar. The first and second side members 110, 120 are adapted to intimately contact a planar surface of a device, not shown, upon which the heat transfer apparatus is placed. In another embodiment, not shown, the first and second side members 110, 120 are shaped to conform to a non-planar surface of the device upon which the heat transfer apparatus is placed. Other cross sectional shapes are within the scope of the invention, wherein the specific cross section is determined by the shape of the device upon which it is coupled and also the thermal management needs of the device.

In the embodiment of FIG. 1A, the first and second side members 110, 120 are in spaced-apart substantially parallel relationship to each other and the connecting member 130 is substantially perpendicular the first and second side members 110, 120 when the side members 110, 120 engage a device. The first and second side members 110, 120 and the connecting member 130 define an elongated channel 140 which is adapted to receive a device after the side members 110, 120 are flexed to "open" the channel 140.

In one embodiment, the heat transfer apparatus 100 is comprised of a resilient material having good thermal conductivity. The heat transfer apparatus 100 is resiliently biased such that after the first and second side members 110, 120 are spread apart for assembly onto the device, the first and second side members 110, 120 return to a flexed position slightly opened beyond the original position so that the first and second side members 110, 120 are in a flexed, pressure applying urging, removable engagement with the device. Examples of materials which the heat transfer apparatus 100 may be comprised include, but not limited to, steel, spring-tempered steel, aluminum, other resilient metals, and thermal-conducting plastics and polymers.

In the embodiment shown in FIGS. 1A and 1B, the first and second edges 118, 128 are formed with a generous radii, for example, but not limited to, a range from 0.1 to 0.3 mm. The generous radii assist in the resiliency of the heat transfer apparatus 100. The generous radii also provide improved structural integrity and strength as compared with edges having smaller radii.

In the embodiment shown in FIGS. 1A and 1B, two portions of the first and second free edges 114, 124 curl outwardly and away from each other forming two first rolled edges 112 and two second rolled edge 122, respectively, and first and second unrolled edges 115, 125, respectively. The rolled edges 112, 122 curl approximately 180 degrees. In other embodiments, the rolled edges 112, 122 curl more or less than 180 degrees. In the instant embodiment, the rolled edges 112, 122 are adapted to accept a tool used to open up the heat transfer apparatus by spreading apart the first and second side members 110, 120. The rolled edges 112, 122 also serve to minimize damage to a device upon which it is placed, which will be discussed below, in comparison with embodiments which do not have rolled edges 112,122.

In the embodiment of FIG. 1A, the first and second unrolled edges 115, 125 comprise a first and second tab 116, 126, respectively, projecting therefrom. A portion of the tabs 116, 126 project inwardly and towards each other, the tabs 116, 126 adapted to engage a device upon which it is placed, which will be further discussed below.

Figure 2:
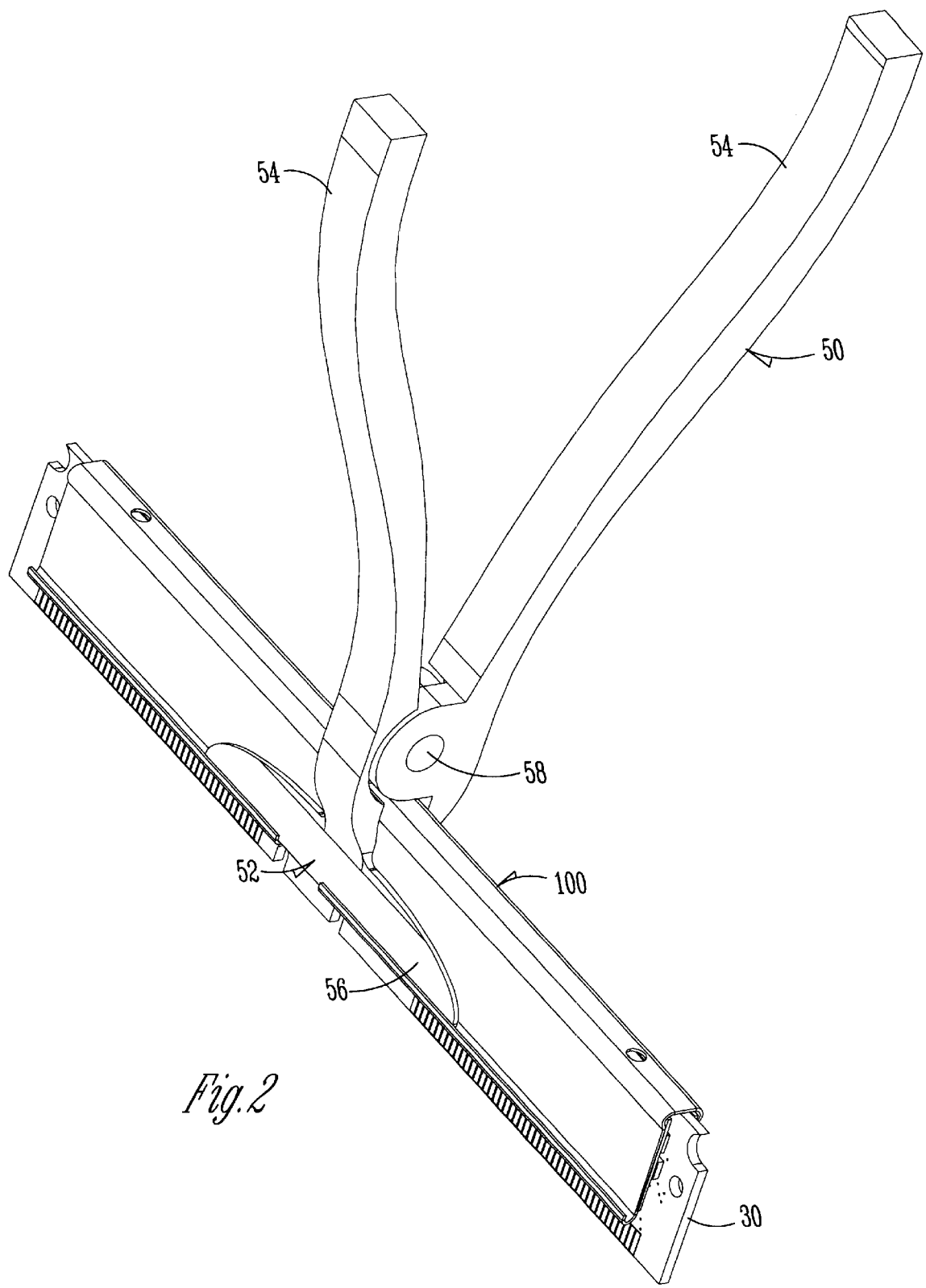
FIG. 2 is a perspective view of an embodiment of a heat transfer apparatus tool adapted to assist in the installation of the heat transfer apparatus onto a device.

FIG. 2 is a perspective view of an embodiment of a heat transfer apparatus tool 50 adapted to assist in the installation of the heat transfer apparatus 100 onto a device 30. The heat transfer apparatus tool 50 comprises a pair of pivotally connected handles 54 and opposing jaws 52. The handles 54 and jaws 52 pivot about a joint 58 such that when the handles 54 are moved together, the jaws 52 open. The jaws 52 further comprise blades 56 which are adapted to engage the rolled edges 112, 122. Upon engagement of the blades 56 with the rolled edges 112, 122 and subsequent squeezing of the handles 54 together, the first and second side members 110, 120 resiliently flex substantially about the first and second edges 118, 128, respectfully, and the first and second free edge 114, 124 are urged away from each other. The heat transfer apparatus 100 may be subsequently positioned over the device 30 such that the device 30 is positioned within the channel 140. Upon release of the handles 54, the first and second free edges 114, 124 return to a flexed position slightly opened beyond the original position so that the first and second side members 110, 120 are in a flexed, pressure applying urging engagement with the device 30. Other methods of spreading the first and second side members 110, 120 prior to engagement with the device are also within the scope of the invention.

FIG. 3A is a perspective view of an embodiment of a heat transfer apparatus 300. FIG. 3B is a cross-sectional view of the same embodiment about the line 3B—3B. The heat transfer apparatus 300 comprises a first side member 310, a second side member 320 and a connecting member 330. The connecting member 330 couples with first and second side members 310, 320 at a first edge 318 and a second edge 328, respectively.

In the embodiment shown in FIG. 3A, the first and second edges 318, 328 are formed with a generous radii, for example, but not limited to, a range from 0.1 to 0.3 mm. The generous radii assist in the resiliency of the heat transfer apparatus 100. The generous radii also provide improved structural integrity and strength as compared with edges having smaller radii.

The heat transfer apparatus 300 is generally rectangular in cross section along line 3B—3B of FIG. 3B. Other cross sectional shapes are within the scope of the invention, wherein the specific cross section is determined by the shape of the device upon which it is attached and also the thermal management needs of the device.

In one embodiment, the heat transfer apparatus 300 is comprised of a resilient material having good thermal conductivity. The heat transfer apparatus 300 is resiliently biased such that after the first and second side members 310, 320 are spread apart for assembly onto the device, the first and second side members 310, 320 return to a flexed position slightly opened beyond the original position so that the first and second side members 310, 320 are in a flexed, pressure applying urging, removable engagement with the device. Examples of materials which the heat transfer apparatus 300 may be comprised include, but not limited to, steel, spring-tempered steel, aluminum, other resilient metals, and thermal-conducting plastics and polymers.

The first and second side members 310, 320 are in spaced-apart substantially parallel and facing relationship to each other and the connecting member 330 is substantially perpendicular to the first or second side members when the side members 310, 320 engage a device. The first and second side members 310, 320 and the connecting member 330 define an elongated channel 340 which is adapted to receive a device after the side members 310, 320 are flexed to "open" the channel 340.

The first and second side members 310, 320 comprise a first and second inner portion 317, 327, respectively, and first and second outer portion 350, 360, respectively, which are coupled together at a rolled edge 312, 322. The first and second outer portions 350, 360 have a corrugated shape, comprising a substantially uniform series of ridges 352 and grooves 354. The first and second outer portions 350, 360 fold back upon the first and second inner portions 317, 327 such that at least one of the grooves 354 comes into contact with the first and second inner portions 317, 327. The contact between the first and second inner portions 317, 327 and the first and second outer portions 350, 360 allows for thermal conduction between the contacting portions. Thermal conduction also takes place between the first and second inner portions 317, 327 and the first and second outer portions 350, 360 via the rolled edges 312, 322. In other embodiments, not shown, there is no contact between the first and second inner portions 317, 327 and the first and second outer portions 350, 360, wherein thermal conduction takes place between the first and second inner portions 317, 327 and the first and second outer portions 350, 360 only via the rolled edges 312, 322.

The corrugated shape of the first and second outer portions 350, 360 provides for an increase in surface area as compared with a flat surface. This increase in surface area provides for more efficient transfer of thermal energy from the heat transfer apparatus 300 into the fluid medium surrounding the heat transfer apparatus 300 and the environment. The height of the ridges 352 and grooves 354 may be increased or decreased to account for an increased or decreased need, respectively, to dissipate more thermal energy by convection. Other shapes of the first and second outer portion 350, 360 other than corrugated are also within the scope of the invention. In other embodiments, not shown, the first and second outer portions 350, 360 comprise other shapes, such as, but not limited to, bumps and dimples, flat, and flat with a roughened surface.

The substantially flat first and second inner portions 317, 327 provide for intimate contact with a relatively flat device placed within the channel 340. In another embodiment, not shown, the first and second inner portions 317, 327 are shaped to conform to a non-planar surface of the device upon which it is placed.

FIG. 3C is an end view of an embodiment of a heat transfer apparatus 300c comprising one outer portion 350c on one of the first and second side members 310c, 320c. The embodiment of FIG. 3C may be used when only one of the first and second side members 310c, 320c will be in contact with heat producing components wherein one outer portion 350c is sufficient to meet the cooling requirements of the device upon which it is placed, and the additional heat dissipating properties of a second outer portion 350c is not needed.

The embodiment of heat transfer apparatus 300 as shown in FIG. 3A includes means to assist in the spreading apart of the first and second side members 310, 320. In the embodiment shown in FIG. 3A, the rolled edges 312, 322 comprise tool-engaging apertures 315, 325. The tool-engaging apertures 315, 325 are adapted to accept the insertion of a mounting tool (not shown) used to open up the heat transfer apparatus by spreading apart the first and second side members 310, 320. One embodiment of a tool suitable for use with the heat transfer apparatus 300 comprises a tool substantially similar to the tool 50 shown in FIG. 2, but with the jaws 52 comprising a pin-shape adapted to couple with the tool-engaging apertures 315, 325.

The rolled edges 312, 322 also serve to minimize damage during application to a device upon which it is to be placed, which will be discussed below, in comparison to an embodiment not having rolled edges 312, 322.

The embodiment of heat transfer apparatus 300 as shown in FIG. 3A further includes tabs 314, 324 that project from the tool-engaging apertures 315, 325. The tabs 314, 324 project inwardly and towards each other and are adapted to engage the device upon which it is placed, which will be further discussed below.

It is appreciated that various shapes and configurations may be used individually or in combination for the first and second side members 310, 320, all of which are within the scope of this disclosure.

Figure 4A:
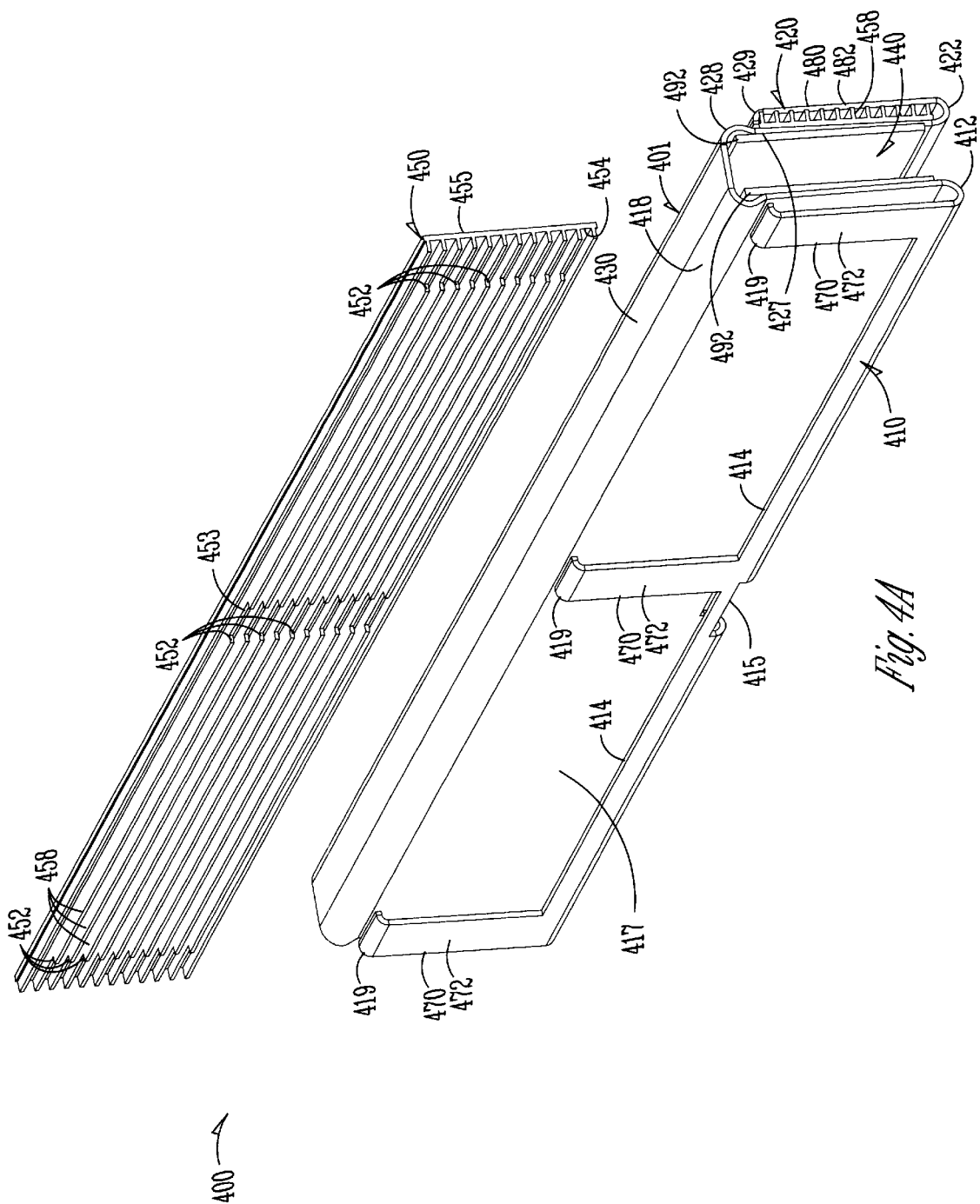

FIG. 4A is an exploded perspective view of an embodiment of a heat transfer apparatus 400 comprising a spring clip 401 and heat transfer member 452. FIG. 4B is a perspective view of the assembled heat transfer apparatus 400 of FIG. 4A. The spring clip 401 comprises a first side member 410, a second side member 420, and a connecting member 430. The connecting member 430 is coupled with first and second side members 410, 420 at a first edge 418 and a second edge 428, respectively. An end view, not shown, presents the spring clip 401 comprising a generally rectangular profile. Other profile shapes are within the scope of the invention, wherein the specific profile is determined by the shape of the device upon which the heat transfer apparatus is attached and also the thermal management needs of the device.

In the embodiment of FIG. 4A, the first and second side members 410, 420 are in a spaced apart, substantially parallel relationship to each other and the connecting member 430 is substantially perpendicular to the first or second side member 410, 420 when the side members 410, 420 engage a device. The first and second side members 410, 420 and the connecting member 430 define an elongated channel 440 which is adapted to receive a device after the side members 410, 420 are flexed to "open" the channel 440.

In one embodiment, the spring clip 401 is comprised of a resilient material having good thermal conductivity. The spring clip 401 is resiliently biased such that after the first and second side members 410, 420 are spread apart for assembly onto the device, the first and second side members 410, 420 return to a flexed position slightly opened beyond the original position so that the first and second side members 410, 420 are in a flexed, pressure applying urging, removable engagement with the device. Examples of materials which the heat transfer apparatus 400 may be comprised include, but not limited to, steel, spring-tempered steel, aluminum, other resilient metals, and thermal-conducting plastics and polymers.

In the embodiment shown in FIG. 4A, the first and second edges 418, 428 are formed with a generous radii, for example, but not limited to, a range from 0.1 to 0.3 mm. The generous radii assist in the resiliency of the spring clip 401. The generous radii also provide improved structural integrity and strength as compared with edges having smaller radii.

The first and second side members 410, 420 comprise a first and second inner portion 417, 427, respectively, and first and second outer portion 470, 480, respectively, which are coupled together at a rolled edge 412, 422, respectively. The first and second inner portions 417, 427 are substantially planar which provides for substantially uniform and intimate contact with a surface of a relatively flat device placed within the channel 440, details of which will be discussed below. In another embodiment, the first and second inner portions 417, 427 are shaped to conform to a non-planar surface of the device upon which the heat transfer apparatus is placed.

In the embodiment of FIG. 4A and 4B, the first and second outer portions 470, 480 comprise at least one first and second arm 472, 482, respectively, that projects from a first and second free edge 414, 424. The first and second arms 472, 482 are spaced apart from but in substantially parallel relationship with the first and second inner portions 417, 427. The first and second arms 472, 482 are adapted to accept a heat transfer member 450 as will be discussed below.

The first and second arms 472, 482 further comprise a retention means 419, 429 that retains the heat transfer member 450 in the spring clip 401. In the embodiment of FIG. 4A, the retention means 419, 429 comprises a rolled edge projecting from the arms 472, 482 and curling towards the first and second inner portions 417, 427. In other embodiments, not shown, the retention means comprises, among others, the spring bias of the first and second arms 472, 482 forcing the heat transfer member 450 against the first and second inner portions 417, 427, respectively, with sufficient force to retain the heat transfer member 450.

The heat transfer member 450 has a generally rectangular plate-like shape comprising a substantially planar first side 455 and a second side 454. The planar first side 455 is adapted to substantially uniformly couple with the substantially planar first or second inner portions 417, 427. Substantially uniform contact between the planar first side 455 and the first or second inner portion 417, 427 is important for efficient conduction of thermal energy between the two elements.

The second side 454 of the heat transfer member 450 is adapted to have a high surface area. In the embodiment of FIG. 4A, the second side 454 comprises a plurality of fins 458. It can be appreciated by those skilled in the art that the size, number, spacing and shape of the fins 458 is determined by the thermal transfer requirements of the device upon which it the heat transfer apparatus 400 is placed. In one embodiment, the second side 454 further comprises arm engagement means 452 that are adapted to engage the arms 472, 482. In the embodiment of FIG. 4A, the arm engagement means 452 comprises portions wherein the fins 458 are shortened creating a depression which is adapted to accommodate an arm 472, 482. In one embodiment, one arm engagement means 452 is a depression 453 adapted to accept an arm 472, 482 therein, preventing side-to-side motion of the heat transfer member 450 with respect to the spring clip 401.

The heat transfer member 450 is adapted to couple with the spring clip 401 by inserting the heat transfer member 450 between one of the first and second inner portions 417, 427 and the corresponding first and second outer portions 470, 480. In one embodiment, the heat transfer member 450 is further retained in the first and second outer portions 470, 480 by retention means 419, 429 which prevent the withdrawal of the heat transfer member 450 from the first and second arms 472, 482.

The heat transfer member 450 is adapted to be scalable to meet the thermal dissipation demands of the device upon which the heat transfer apparatus is attached, as would be appreciated by those skilled in the art. For example, among others, the heat transfer member 450 comprises a flat plate used to distribute the heat throughout the heat transfer member 450. In another embodiment, the heat transfer member 450 comprises relatively tall fins 458 to dissipate a greater quantity of heat or to dissipate the heat at a faster rate when compared with embodiments having shorter fins 458 or no fins 458.

In another embodiment, the fins 458 may take the form of pins, not shown, that increase the effective surface area of the second side 452 increasing the transfer of thermal energy from the heat transfer apparatus 400 into the fluid medium surrounding the heat transfer apparatus 400 and into the environment. A different heat transfer member 450 configuration may be used in each of the first and second outer portions 470, 480 to tailor the heat management needs of a particular device upon which the heat transfer apparatus 400 is placed. In one embodiment, one heat transfer member 450 is used in either the first or second side members 410, 420 wherein only one of the first or second inner portions 417, 427 is exposed to heat. This embodiment is appropriate in applications wherein one heat transfer member 450 is sufficient to meet the cooling requirements of the device upon which the heat transfer apparatus is placed, and the additional heat dissipating property of a second heat transfer member 450 is not needed.

In one embodiment, the heat transfer apparatus 400 further comprises means to assist in the spreading apart of the first and second side members 410, 420. In the embodiment shown in FIG. 4A, the means to assist in the spreading apart of the first and second side members 410, 420 comprises one or more tool-engaging holes 415 in a portion of the rolled edge 412, 422 of the first and second side members 410, 420. The tool-engaging holes 415 are adapted to allow the engagement of a mounting tool therein, not shown. In another embodiment, a mounting tool, not shown but similar to the tool 50 shown in FIG. 2, is adapted to be received between the arms 472, 482 to engage the rolled edges 412, 422 from above. In either embodiment, the mounting tool is used to open up the spring clip 401 by spreading apart the first and second side members 410, 420 such that a device can be inserted into the channel 440.

The rolled edges 412, 422 are adapted to minimize damage to the device upon which it is placed, which will be discussed below, in comparison to an embodiment wherein the edge is more sharp. In one embodiment, the heat transfer member 450 is coupled to the spring clip 401 after the heat transfer apparatus 400 is coupled to the device, as will be discussed below. In another embodiment, the heat transfer member 450 is coupled to the spring clip 401 before the heat transfer apparatus 400 is coupled to the device.

In one embodiment, the heat transfer apparatus 400 further comprises tabs, not shown, substantially similar to the tabs 314, 324 in FIG. 3A, which project from the tool-engaging holes 415. The tabs would function substantially similar to the tabs 314, 324 which project inwardly and towards each other and are adapted to engage the device upon which it is placed.

FIG. 5A is a perspective view of an embodiment of a heat transfer apparatus 500. FIG. 5B is a side view of the same embodiment. The heat transfer apparatus 500 comprises a first side member 510, a second side member 520 and a connecting member 530. The connecting member 530 couples with first and second side members 510, 520 at a first edge 518 and a second edge 528, respectively. The heat transfer apparatus 500 is generally rectangular in profile as shown in FIG. 5B. Other profile shapes are within the scope of the invention, wherein the specific profile is determined by the shape of the device upon which it is attached and also the thermal management needs of the device. In the embodiment of FIG. 5A, the first and second side members 510, 520 are in spaced-apart substantially parallel relationship to each other and the connecting member 530 is substantially perpendicular to the first or second side member 510, 520 when the side members 510, 520 engage a device. The first and second side members 510, 520 and the connecting member 530 define an elongated channel 540 which is adapted to receive a device after the side members 510, 520 are flexed to "open" the channel 540.

In one embodiment, the heat transfer apparatus 500 is comprised of a resilient material having good thermal conductivity. The heat transfer apparatus 500 is resiliently biased such that after the first and second side members 510, 520 are spread apart for assembly onto the device, the first and second side members 510, 520 return to a flexed position slightly opened beyond the original position so that the first and second side members 510, 520 are in a flexed, pressure applying urging, removable engagement with the device. Examples of materials which the heat transfer apparatus 500 may be comprised include, but not limited to, steel, spring-tempered steel, aluminum, other resilient metals, and thermal-conducting plastics and polymers.

In the embodiment shown in FIGS. 5A and 5B, the first and second edges 518, 528 are formed with a generous radii, for example, but not limited to, a range from 0.1 to 0.3 mm. The generous radii assist in the resiliency of the heat transfer apparatus 500. The generous radii also provide improved structural integrity and strength as compared with edges having smaller radii.

The first and second side members 510, 520 comprise a first and second inner portion 517, 527, respectively, and first and second outer portion 550, 560, respectively, which are coupled together at a rolled edge 512, 522. The first and second outer portions 550, 560 fold back upon and in close proximity with the first and second inner portions 517, 527, wherein thermal conduction between the portions will occur via the rolled edges 512, 522.

In one embodiment, at least a portion of the first and second inner portions 517, 527 and the first and second outer portions 550, 560 are in contact, wherein thermal conduction between the contacting portions, as well as via the rolled edges 512, 522 will occur.

The first and second outer portions 550, 560 further comprise a plurality of elongated first and second fingers 570, 580, respectively, projecting from a first and second outer edge 514, 524 opposite the first rolled edge 512, 522. The first and second fingers 570, 580 curl outwardly and away from the connecting member 530. The first and second fingers 570, 580 assist in dissipating thermal energy by increasing the surface area of the heat transfer apparatus 500.

In one embodiment, the first and second fingers 570, 580 comprise a first and second contact surface 571, 581 adapted to make contact and thermal engagement with a secondary structure. In the embodiment of FIG. 5A, the first and second fingers 570, 580 extend away such that the first and second contact surfaces 571, 581 lie substantially perpendicular to the first and second inner portions 517, 527. The fingers 570, 580, and more particularly, the first and second contact surfaces 571, 581 are adapted to engage a structure adjacent to the first and second contact surfaces 571, 581. The first and second fingers 570, 580 comprise a resilient material such that when engaged by an adjacent structure, the first and second fingers 570, 580 have a spring bias which urges the first and second fingers 570, 580 into contact with the adjacent structure, as will be discussed below.

The embodiment of the heat transfer apparatus 500 of FIG. 5A is advantageously used for many applications. For example, among others, the plurality of first and second fingers 570, 580 provide a surface area for free convection of thermal energy into the environment.

Also, for example, among others, the heat transfer apparatus 500 may be used where it is desired to conduct thermal energy from a heat-producing device to an external structure, such as, but not limited to, a heat sink or an enclosure. The height of the first and second fingers 570, 580 may be increased or decreased to account for the distance the heat transfer apparatus 500 is away from the external structure, to ensure proper contact between the first and second fingers 570, 580 and the external structure. Also, the height of the first and second fingers 570, 580 may be increased or decreased to accommodate an external structure having a surface contour, such as, among others, an external structure having an uneven or sloping surface. The resiliency of the first and second fingers 570, 580 reduce the need for relatively close tolerances of the distance between the external structure and the heat transfer apparatus 500 while ensuring contact between the first and second contact surfaces 571, 581 and the external structure.

Other configurations of the first and second fingers 570, 580 are within the scope of the invention. In the embodiment of FIG. 5A, the first fingers 570 projecting from the first outer portion 550 are in staggered relationship with the second fingers 580 projecting from the second outer portion 560. The staggered relationship of the fingers 570, 580 in this embodiment allows for the placement of a plurality of heat transfer apparatuses 500 in side-by-side close proximity to each other with substantially no interference between adjacent fingers, as will be discussed below.

In one embodiment of the heat transfer apparatus 500, means for spreading apart the first and second side members 510, 520 in similar fashion as discussed above is provided. The rolled edges 512, 522 also serve to minimize damage to a device upon which it is placed, which will be discusses below, in comparison to an embodiment wherein the edge is more sharp. In another embodiment, the heat transfer apparatus 500 further includes tabs in similar fashion as described above to engage a device upon which it is placed.

FIG. 6A is an exploded perspective view of an embodiment of a heat transfer apparatus 600 comprising one or more spring clips 610, 611 and one or more heat transfer members 650. FIG. 6B is a perspective view of the assembled heat transfer apparatus 600 of FIG. 6A. The spring clip 610, 611 comprises a first side member 620, a second side member 640, and a connecting member 630. The connecting member 630 is coupled with first and second side members 620, 640 at a first edge 618 and a second edge 628, respectively. The spring clip 610, 611 comprises a generally rectangular end-view profile. Other end-view profile shapes are within the scope of the invention, wherein the specific profile is determined by the shape of the device upon which it is attached and also the thermal management needs of the device. In the embodiment of FIG. 6A, the first and second side members 620, 640 are in a spaced apart, substantially parallel relationship to each other and the connecting member 630 is substantially perpendicular to the first or second side member 620, 640 when the side members 620, 640 engage heat transfer members 650. The first and second side members 620, 640 and the connecting member 630 define a channel 632 which is adapted to receive heat transfer members 650 and a device 900 after the side members 620, 640 are flexed to "open" the channel 632.

The separate heat transfer member 650 has a generally rectangular plate-like shape comprising a substantially planar first side 655 and a second side 654. The planar first side 655 is adapted to couple with the device 900 upon which it is placed. Contact between the planar first side 655 and the heat producing portions of the device 900 is important for efficient conduction of thermal energy between the two elements.

The second side 654 of the heat transfer member 650 is adapted to have a high surface area. In one embodiment, the second side 654 is smooth and is adapted to spread thermal energy across its surface. In the embodiment of FIG. 6A, the second side 654 comprises a plurality of fins 658. It can be appreciated by those skilled in the art that the size, number, spacing and shape of the fins 658 is determined by the thermal transfer requirements of the device upon which the heat transfer apparatus 600 is placed. It can also be appreciated that instead of fins 658, in other embodiments, the second side 654 can comprise pins, corrugations, or other heat dissipation augmenting means.

In one embodiment, the second side 654 further comprises clip engagement means in the form of depressions 652 that are adapted to engage either the first or second detent portion 622, 642 of the spring clips 610, 611. The depressions 652 comprise areas wherein the fins 658 are shortened or notched creating a depression which is adapted to accommodate either the first or second detent portion 622, 642 of the spring clips 610, 611. In one embodiment, the depressions 652 are adapted to laterally restrain the heat transfer member 650, wherein the depressions 652 are notched to accept the first or second detent portion 622, 642 therein, preventing side-to-side motion of the heat transfer member 650 with respect to the spring clip 610, 611.

The spring clip 610, 611 is adapted to couple with one or more heat transfer members 650 by sliding engagement of the spring clip 610, 611 onto an assembly comprising one or more heat transfer members 650 and the device 900, such that a portion of the assembly is within the channel 632. The spring bias of the spring clip 610, 611 holds the heat transfer members 650 against the device 900. In the embodiment of FIG. 6B, the first and second heat transfer members 650 are held against the device 900 by the spring clips 610, 611.

In one embodiment, the first and second side members 620, 640 further comprise a first and second flare portion 624, 644, respectively, which flare outwardly to assist in the sliding engagement of the spring clip 610, 611 over the heat transfer members 650. The flare portions 624, 644 also are adapted to minimize damage to the heat transfer members 650 during assembly.

The heat transfer member 650 is adapted to be scalable to meet the thermal dissipation demands of the device upon which it is attached, as would be appreciated by those skilled in the art. For example, among others, the fins 658 may be made taller to dissipate a greater quantity of heat or to dissipate the heat at a faster rate. The fins 658 may take the form of pins that increase the effective surface area of the second side 652 further increasing thermal transfer to the environment. A different heat transfer member 650 configuration may be used on each side of the device 900 to tailor the heat management needs of the device 900 upon which the heat transfer apparatus 600 is placed.

In one embodiment, one heat transfer member 650 is used when one heat transfer member 650 is sufficient to meet the cooling requirements of the device 900, and the additional heat dissipating properties of a second heat transfer member 650 is not needed. An electrically insulating means may be used to electrically insulate the spring clip 610, 611 from the device 900 where no heat transfer member 650 is used, if required.

In one embodiment, the first and second side members 620, 640 of the spring clip 611 further comprises inwardly-projecting tabs 616, 626, shown in FIG. 6C. The tabs 616, 626 are adapted to engage apertures 617 in the device 900 upon which it is placed. The tabs 616, 626 prevent dislodgment of the clip 611 from the device 900 while substantially preventing shifting of the heat transfer apparatus 600.

The heat transfer member 650 is comprised of a material having good thermal conductivity, such as, but not limited to, aluminum, copper, and the like. This allows for the efficient transfer of heat from the device 900 to the heat transfer member 650. The heat is subsequently conducted to the second side 654 and ultimately to the surrounding environment.

Thermal conduction aids may be used with any of the aforementioned embodiments. In one embodiment of the heat transfer apparatus, a thermal conduction aid is used between the electronic device and the heat transfer apparatus. In the embodiment of FIG. 4A, a thermal conduction aid 492 is shown. The thermal conduction aid 492 assists in the transfer of heat to the heat transfer apparatus 400 by improving the surface contact between a device, not shown, and the heat transfer apparatus 400. The thermal conduction aid 492 "fills-in" any gaps between the device, not shown, and the first and second inner portions 417, 427. Examples of thermal conduction aids include, but are not limited to, thermal conductive grease, soft metallic foil, and metal impregnated paste. One skilled in the art can appreciate that thermal conduction aids may be used with all the disclosed embodiments herein.

Also, thermal conduction aids may be used, not only for device/heat transfer apparatus contact areas but also between elements that comprise the heat transfer apparatus, such as those in the embodiments shown in FIGS. 3A–C, 4A–B, and 5AB–B. For example, referring to FIG. 5A, among others, a thermal conduction aid may be used between the first inner portion 517 and the first outer portion 550 to assist in the transfer of heat from the first inner portion 517 to the first outer portion 550 and subsequently to the fingers 570.

Application to Memory Devices

The following embodiments are examples of how the various heat transfer apparatus embodiments described above may be used on a specific memory module. The following embodiments are for illustrative purposes only and are not limited thereto. The scope of the invention is not to be limited by use on any specific memory module nor to computer assemblies in general. The scope of the invention includes, but is not limited to, any device or apparatus requiring the benefits of a heat transfer apparatus.

Figure 7:
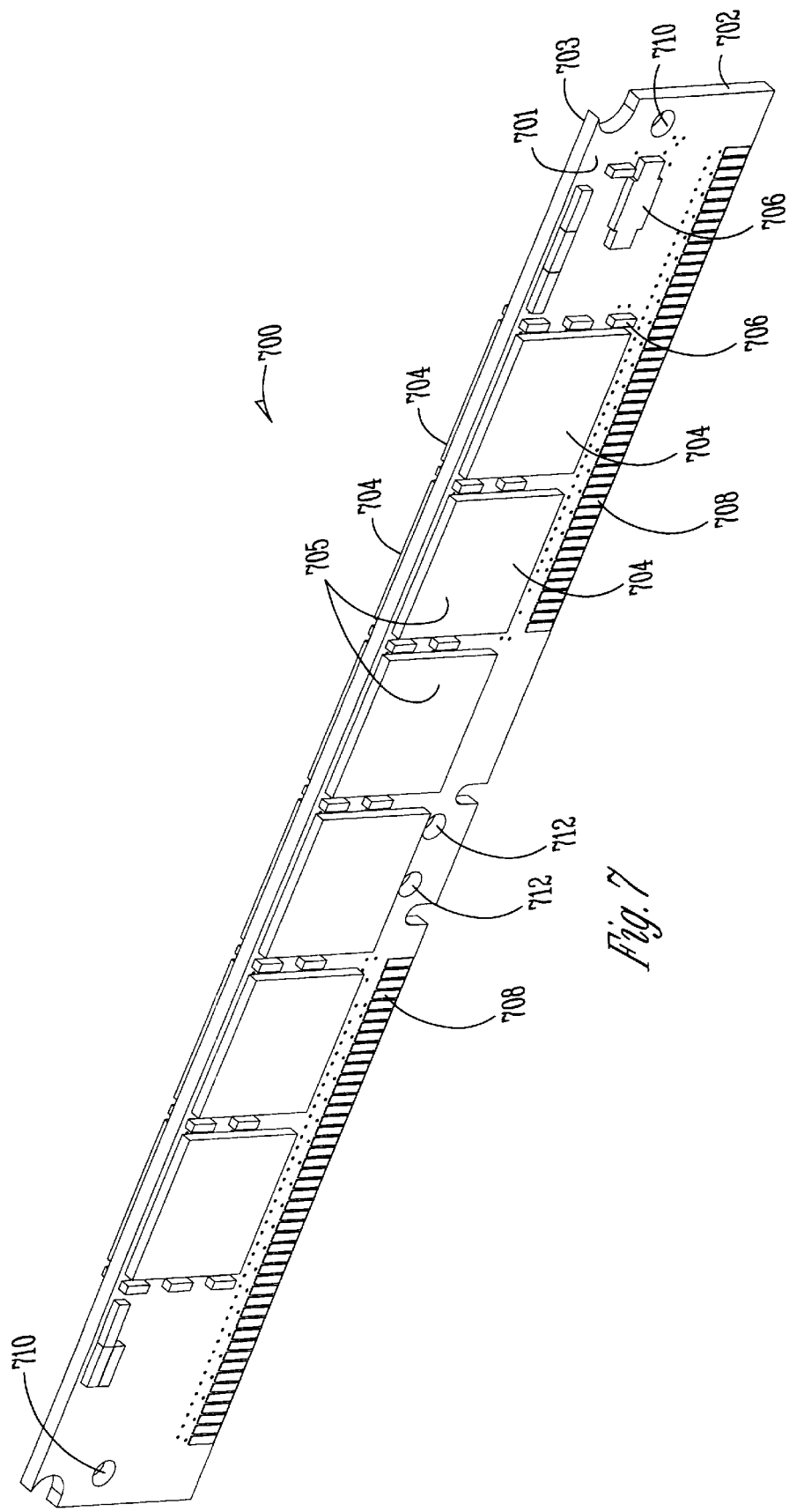
FIG. 7 is a perspective view of an embodiment of a reduced height Dual In-line Memory Module (RH-DIMM).

FIG. 7 is a perspective view of an embodiment of a reduced height Dual In-line Memory Module (RH-DIMM) 700. There are three major components that make up the RH-DIMM 700: dynamic random access memory (DRAM) chips 704, a printed circuit board (PCB) 702, and other "on-board" elements 706 such as resistors and capacitors. Memory chips 704 are mounted on both a first side 701 and a second side 703 of the PCB 702. The memory chips 704 are mounted such that they lie flat against the PCB 702. The memory chips 704 extend substantially the same distance above the first and second surfaces 701, 703 of the PCB 702. Therefore, the back surfaces 705 of the memory chips 704 are substantially coplanar with the adjacent memory chips 704 on either the first or second side 701, 703 of the PCB 702.

The RH-DIMM 700 has electrical contacts 708, the function of which will be described below. The PCB 702 comprises two first apertures 710 and two second apertures 712. The reduced height of the RH-DIMM 700 precludes the placement of one aperture 710 at each corner of the PCB 702 required for proper riveting of a conventional heat transfer apparatus to the PCB 702.

Figure 8:
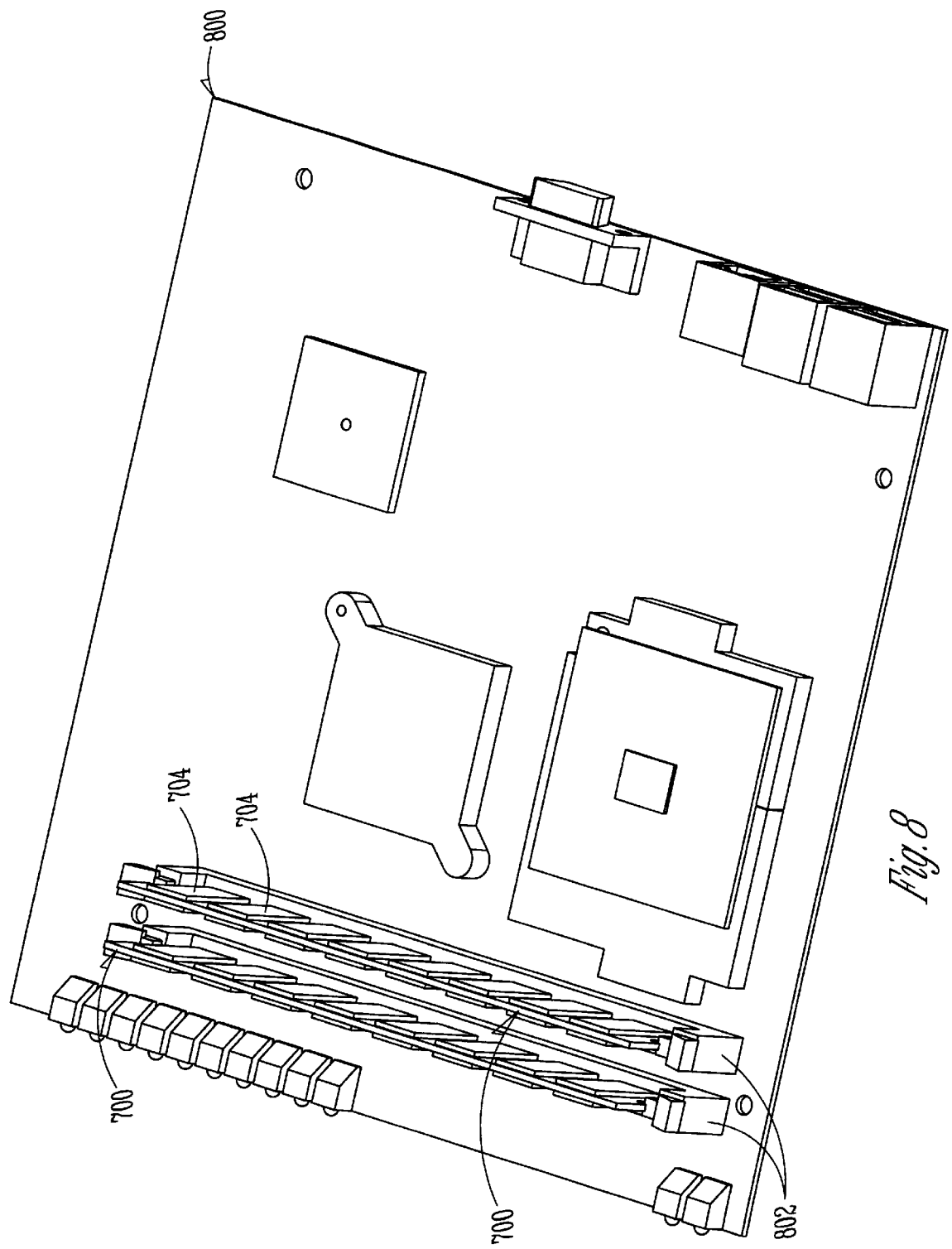
FIG. 8 is a perspective view, respectively, of an embodiment of two RH-DIMMs coupled to a substrate.

FIG. 8 is a perspective of an embodiment of two RH-DIMMs 700 coupled to a substrate 800. In one embodiment, the substrate 800 comprises a printed circuit board. In the embodiment of FIGS. 8A and 8B, the substrate 800 comprises what is known in the art as a motherboard. The RH-DIMMs 700 are coupled to the substrate 800 by inserting the electrical contacts 708 into sockets 802 attached to the substrate 800. The RH-DIMMs 700 present opposing surfaces 701, 703 substantially perpendicular to the surface of the substrate 800. The RH-DIMMs 700 and the substrate 800 are elements of a computer system, such as, but not limited to, a personal computer (PC).

Figure 9A:
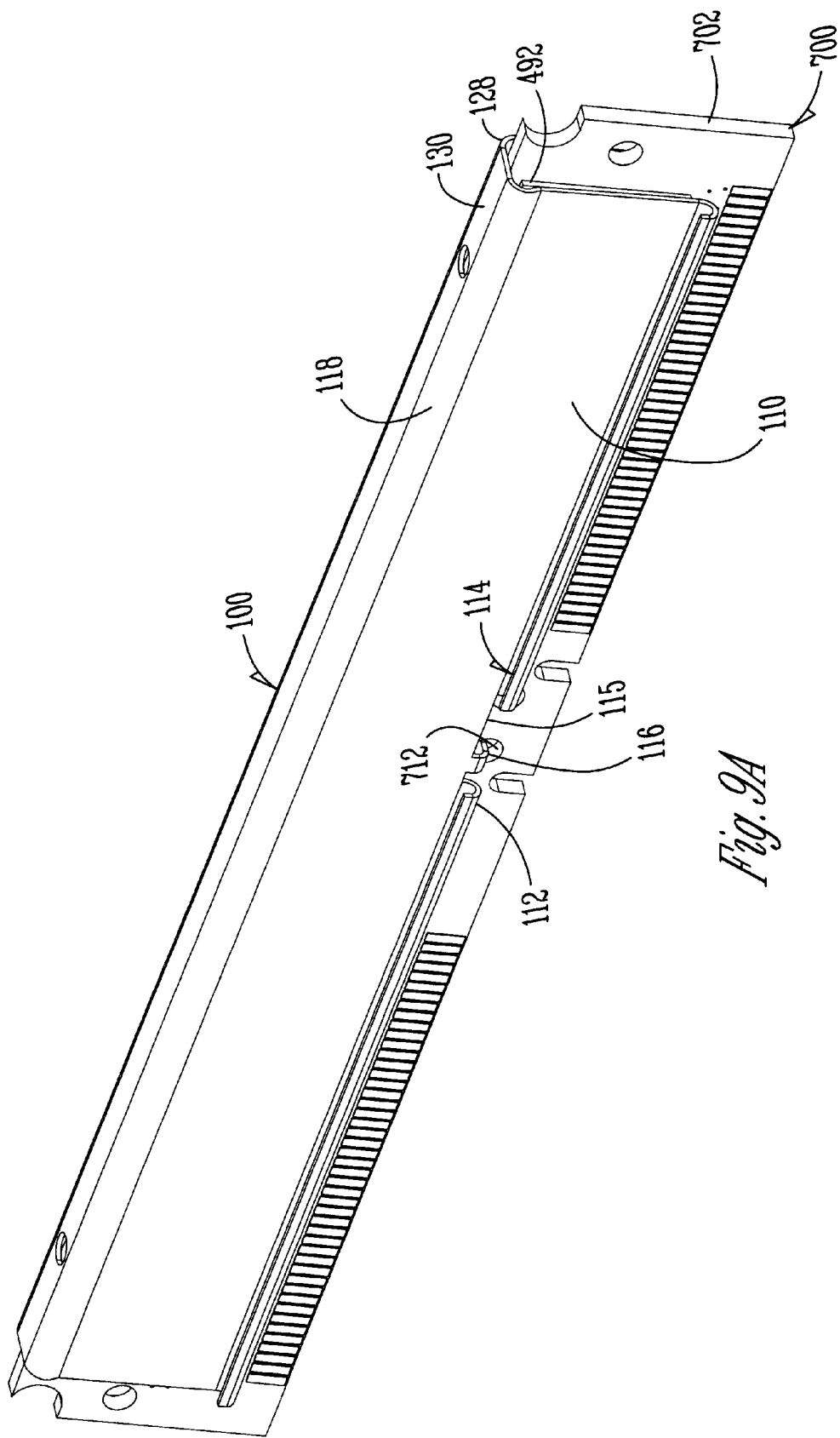
Figure 9C:
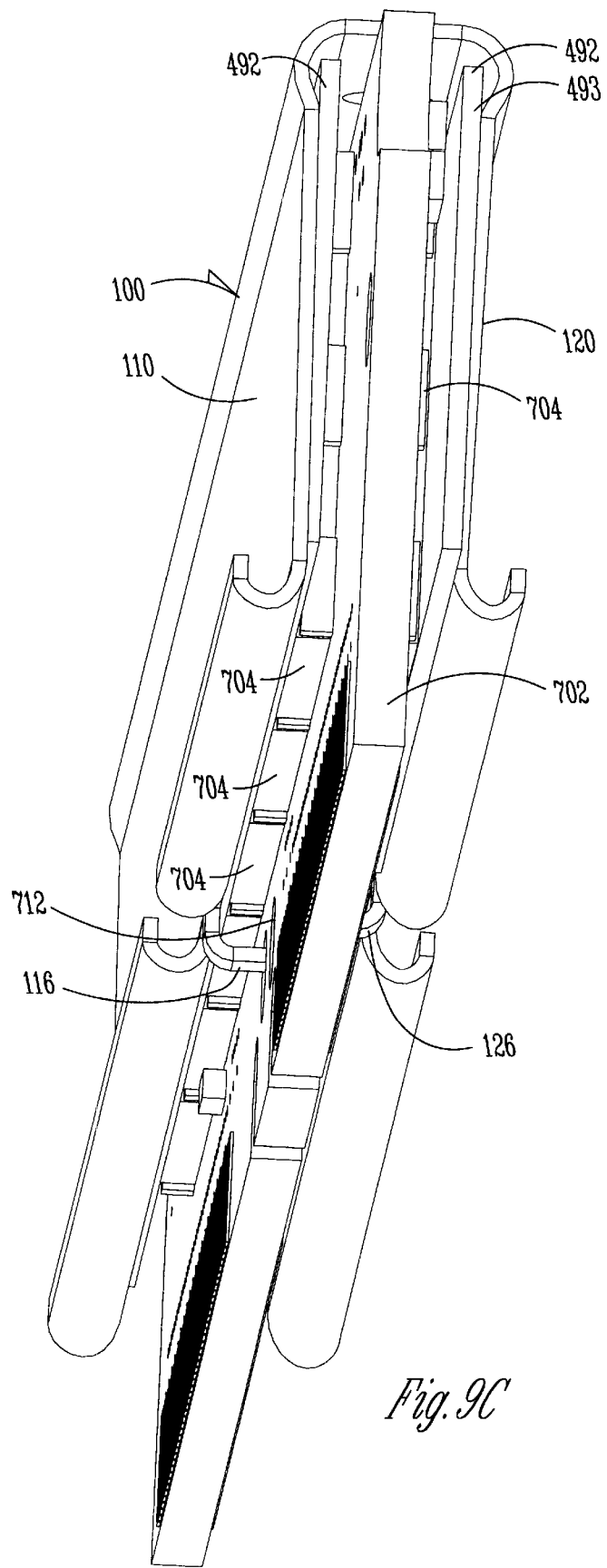

FIGS. 9A–9C are perspective views of an embodiment of a heat transfer apparatus 100 of FIG. 1A coupled to a RH-DIMM 700. The heat transfer apparatus 100 comprises a first side member 110, a second side member 120, and a connecting member 130. The connecting member 130 couples with the first and second side members 110, 120 at a first edge 118 and a second edge 128, respectively. The first and second side members 110, 120 further comprise a first and second free edge 114, 124 opposite the first and second edges 118, 128. The first and second side members 110, 120 and the connecting member 130 define an elongated substantially rectangular channel 140.

The heat transfer apparatus 100 is comprised of a resilient material having good thermal conductivity. The heat transfer apparatus 100 is resiliently biased such that after the first and second side members 110, 120 are spread apart for assembly onto the RH-DIMM 700, the first and second side members 110, 120 return to a flexed position slightly opened beyond the original position so that the first and second side members 110, 120 are in a flexed, pressure applying urging, removable engagement with the RH-DIMM 700.

Figure 9D:
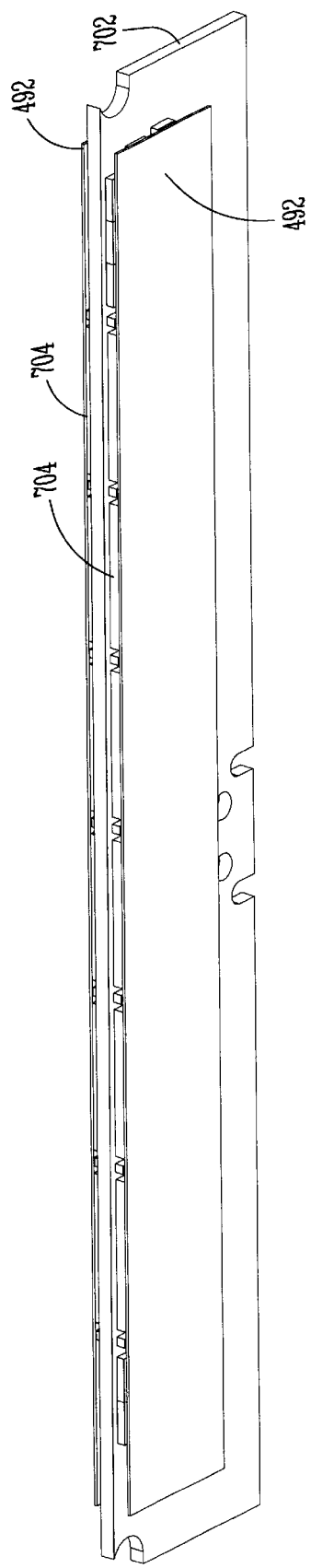
FIG. 9D is a perspective view of an embodiment of insulating sheets coupled to a RH-DIMM.

A tool is used to open up the heat transfer apparatus 100 by spreading apart the first and second side members 110, 120 for subsequent placement of the RH-DIMM 700 into the channel 140. A thermal conduction aid 492, further shown in FIG. 9D, is provided between the first and second side members 110, 120 and the memory chips 704 to ensure good thermal conduction between the first and second side members 110, 120 and the memory chips 704.

In the embodiment of FIGS. 9A–9C, the heat transfer apparatus 100 further includes tabs 116, 126. The tabs 116, 126 project from the first and second free edge 114, 124, respectively. The tabs 116, 126 project inwardly and towards each other. The tabs 116, 126 engage the second apertures 712 of the PCB 702. The engagement of the tabs 116, 126 with the second apertures 712 provides for a locking means of the heat transfer apparatus 100 with the RH-DIMM 700. This locking means substantially prevents movement between the heat transfer apparatus 100 and the RH-DIMM 700.

In another embodiment, not shown, the RH-DIMM 700 comprises memory chips on only one side of the PCB and exposed vias and solder connections on the other side. Referring to FIG. 9C for reference, one of the two thermal conduction aids 492 is replaced by an insulating layer 493 to ensure that the vias and solder connections are electrically insulated from the heat transfer apparatus 100.

FIG. 9E is a side view of an embodiment of heat transfer apparatuses 100 coupled to two RH-DIMMs 700 which themselves are coupled to a substrate 800 suitable for use in a computer system, not shown. The RH-DIMMs 700 are coupled to the substrate 800 by inserting the two mating electrical contacts 708 into sockets 802 attached to the substrate 800. The RH-DIMMs 700 and the substrate 800 are elements of a computer system, such as, but not limited to, a personal computer (PC).

Figure 10:
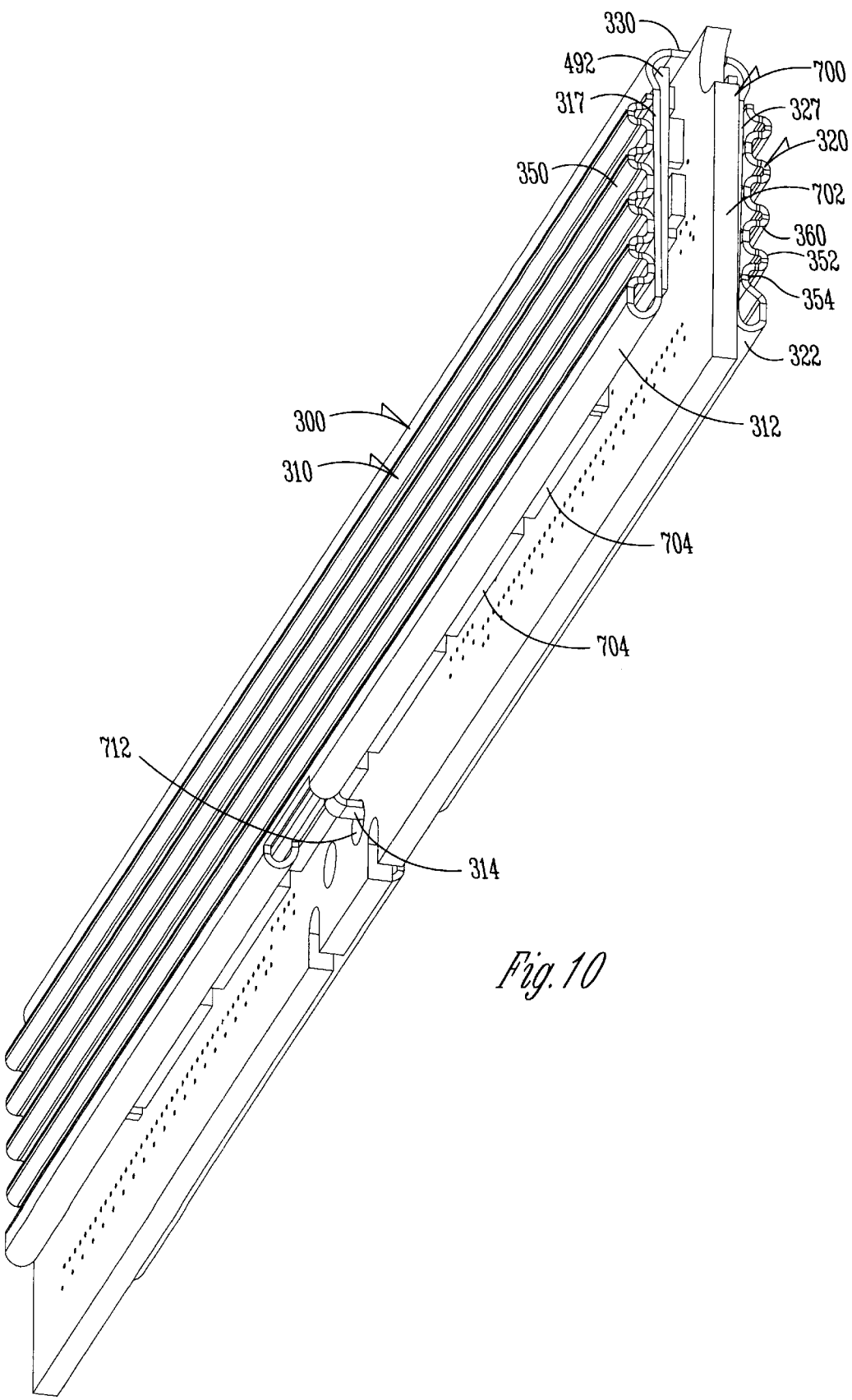
FIG. 10 is a perspective view of an embodiment of the heat transfer apparatus coupled to a RH-DIMM.

FIG. 10 is a perspective view of an embodiment of the heat transfer apparatus 300 of FIG. 3 coupled to a RH-DIMM 700. The heat transfer apparatus 300 comprises a first side member 310, a second side member 320, and a connecting member 330. The first and second side members 310, 320 and the connecting member 330 define an elongated substantially rectangular channel 340.

The first and second side members 310, 320 comprise a first and second inner portion 317, 327, respectively, and first and second outer portion 350, 360, respectively, which are coupled together at a rolled edge 312, 322. The first and second outer portions 350, 360 have a corrugated shape, comprising a series of ridges 352 and grooves 354. The first and second outer portions 350, 360 fold back upon the first and second inner portions 317, 327 such that the grooves 354 come into contact with the first and second inner portions 317, 327. The contact between the first and second inner portions 317, 327 and the first and second outer portions 350, 360 allows for thermal conduction between the contacting portions.

The heat transfer apparatus 300 is comprised of a resilient material having good thermal conductivity. The heat transfer apparatus 300 is resiliently biased such that after the first and second side members 310, 320 are spread apart for assembly onto the device, the first and second side members 310, 320 return to a flexed position slightly opened beyond the original position so that the first and second side members 310, 320 are in a flexed, pressure applying urging, removable engagement with the RH-DIMM 700.

A thermal conduction aid 492 is provided between the first and second side members 310, 320 and the memory chips 704 to ensure good thermal conduction between the first and second side members 310, 320 and the memory chips 704.

The heat transfer apparatus 300 includes tabs 314, 324 that engage the second apertures 712 of the PCB 702. The engagement of the tabs 314, 324 with the second apertures 712 provides for a locking attachment of the heat transfer apparatus 300 with the RH-DIMM 700. This locking attachment provides a means to substantially prevent movement between the heat transfer apparatus 300 and the RH-DIMM 700.

Figure 11:
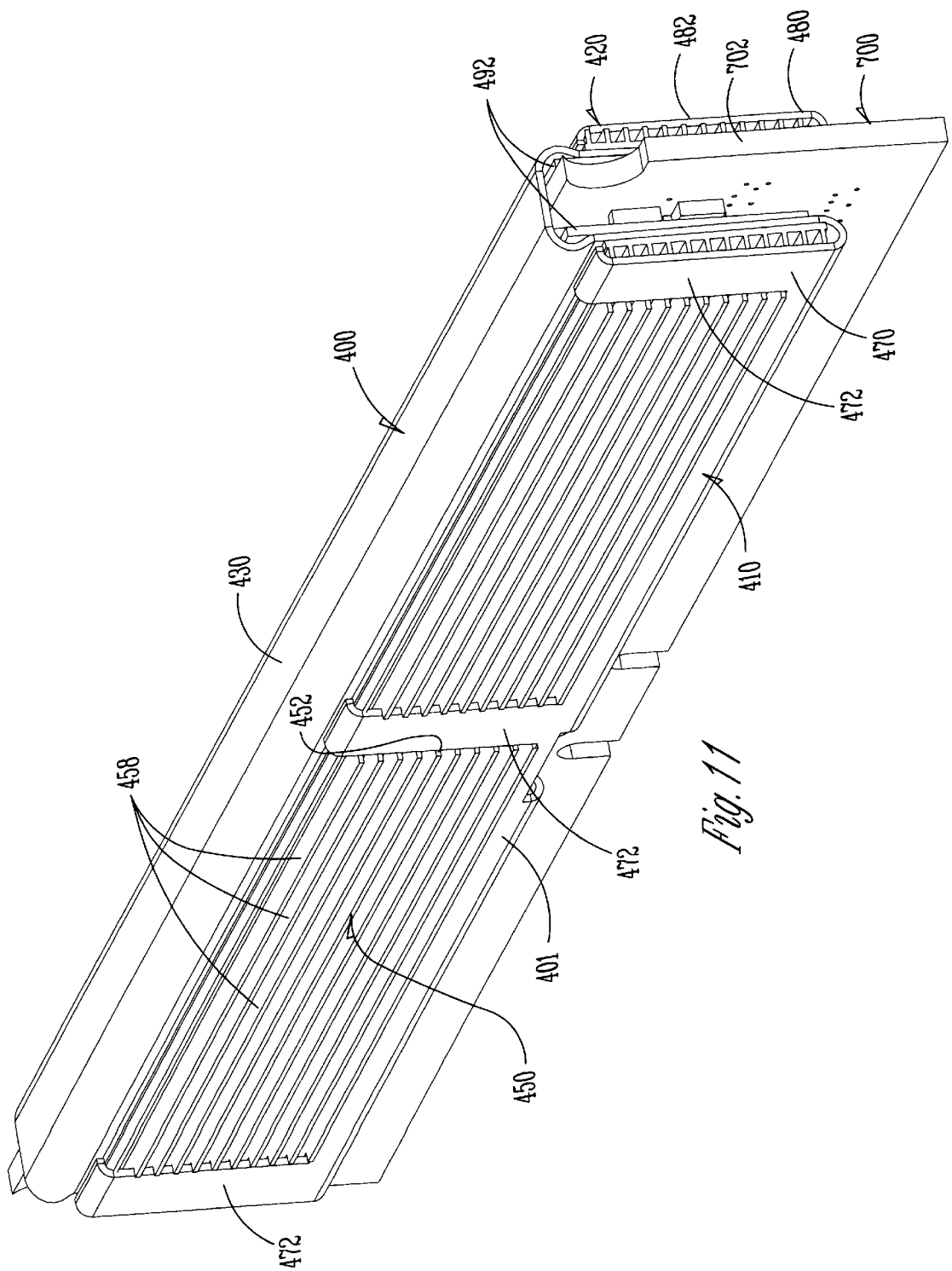
FIG. 11 is a perspective view of an embodiment of the heat transfer apparatus coupled to a RH-DIMM.

FIG. 11 is a perspective view of an embodiment of the heat transfer apparatus 400 of FIG. 4 coupled to a RH-DIMM 700. Heat transfer apparatus 400 comprises a spring clip 401 and heat transfer member 450. The spring clip 401 comprises a first side member 410, a second side member 420 and a connecting member 430. The first and second side members 410, 420 and the connecting member 430 define an elongated substantially rectangular channel 440. The first and second side members 410, 420 comprise a first and second outer portion 470, 480, respectively. The first and second outer portions 470, 480 comprise three first and second arms 472, 482, respectively, that project from a first and second free edge 414, 424. The first and second arms 472, 482 are spaced apart from but in substantially parallel facing relationship with the first and second inner portions 417, 427.

The spring clip 401 comprises a resilient material having good thermal conductivity. The spring clip 401 is resiliently biased such that after the first and second side members 410, 420 are spread apart for assembly onto the device, the first and second side members 410, 420 return to a flexed position slightly opened beyond the original position so that the first and second side members 410, 420 are in a flexed, pressure applying urging, removable engagement with the device.

The first and second side members 410, 420 are spread-apart for subsequent placement of the RH-DIMM 700 into the channel 440. A thermal conduction aid 492 is provided between the first and second side members 410, 420 and the memory chips 704, hidden from view, to ensure good thermal conduction between the first and second side members 410, 420 and the memory chips 704.

After the spring clip 401 is placed onto the RH-DIMM 700, the heat transfer members 450 are inserted between first and side members 410, 420 and the first and second arms 472, 482.

Figure 12A:
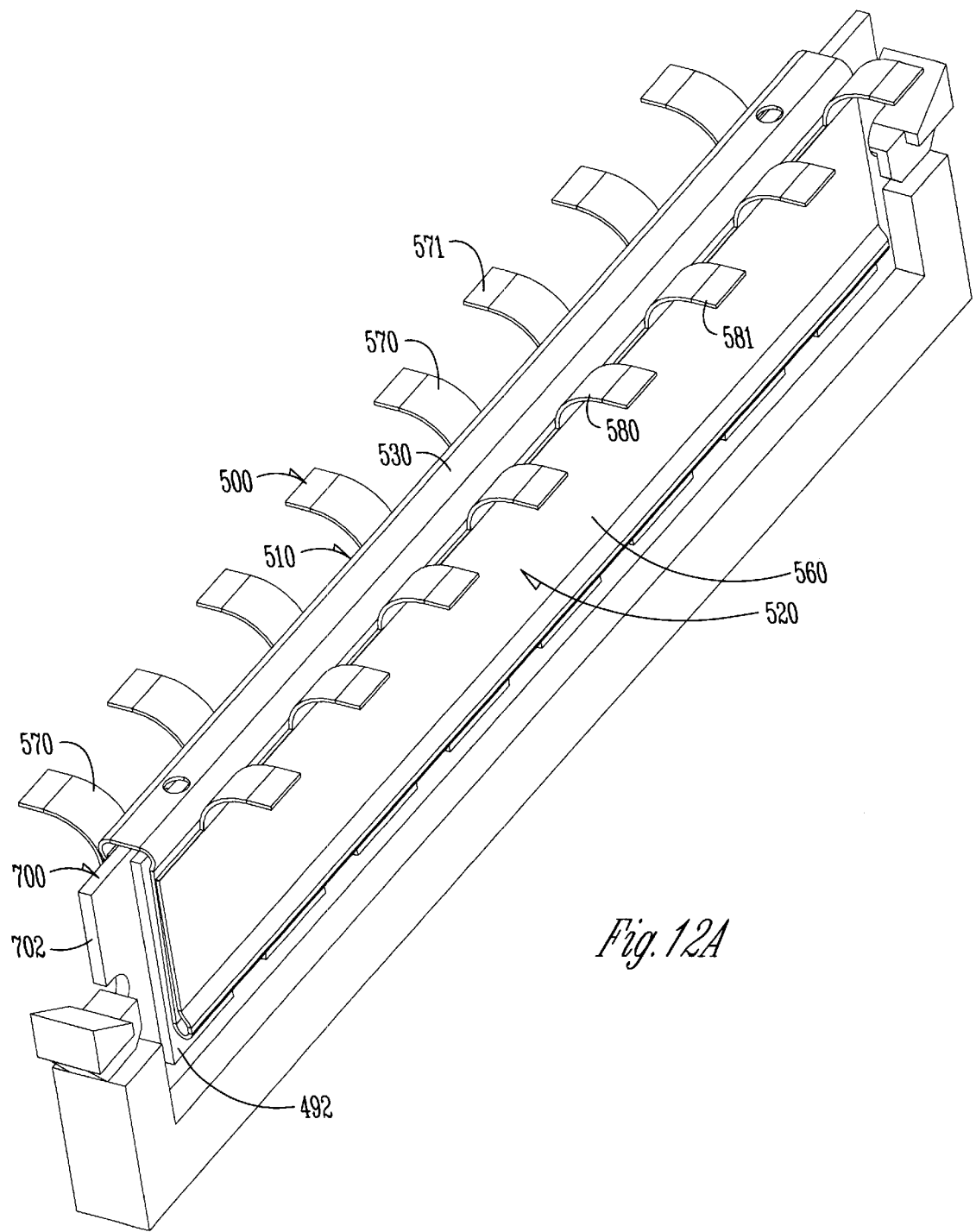
FIG. 12A is a perspective view of an embodiment of the heat transfer apparatus coupled to a RH-DIMM.

FIG. 12A is a perspective view of an embodiment of the heat transfer apparatus 500 of FIG. 5A coupled to a RH-DIMM 700. The heat transfer apparatus 500 comprises a first side member 510, a second side member 520, and a connecting member 530. The first and second side members 510, 520 and the connecting member 530 define an elongated substantially rectangular channel 540.

The heat transfer apparatus 500 is resiliently biased such that after the first and second side members 510, 520 are spread apart for assembly onto the device, the first and second side members 510, 520 return to a flexed position slightly opened beyond the original position so that the first and second side members 510, 520 are in a flexed, pressure applying urging, removable engagement with the RH-DIMM 700.

The first and second side members 510, 520 are spread-apart for subsequent placement of the RH-DIMM 700 into the channel 540. A thermal conduction aid 492 is provided between the first and second side members 510, 520 and the memory chips 704 to ensure good thermal conduction between the first and second side members 110, 120 and the memory chips 704.

The first and second outer portions 550, 560 further comprise elongated first and second fingers 570, 580, respectively, which project therefrom. The first and second fingers 570, 580 curl outwardly and away from the connecting member 530. FIG. 12B is a perspective view of an embodiment of a plurality of heat transfer apparatuses 500 coupled to a plurality of RH-DIMMs 700. The RH-DIMMs 700 are coupled to a substrate 810 by inserting the mating electrical contacts 708 into sockets 812 attached to the substrate 810. The first fingers 570 are in staggered relationship with the second fingers 580 which provides for the placement of a plurality of heat transfer apparatuses 500 in side-by-side close proximity to each other with substantially no interference between adjacent fingers 570, 580.

Figure 12C:
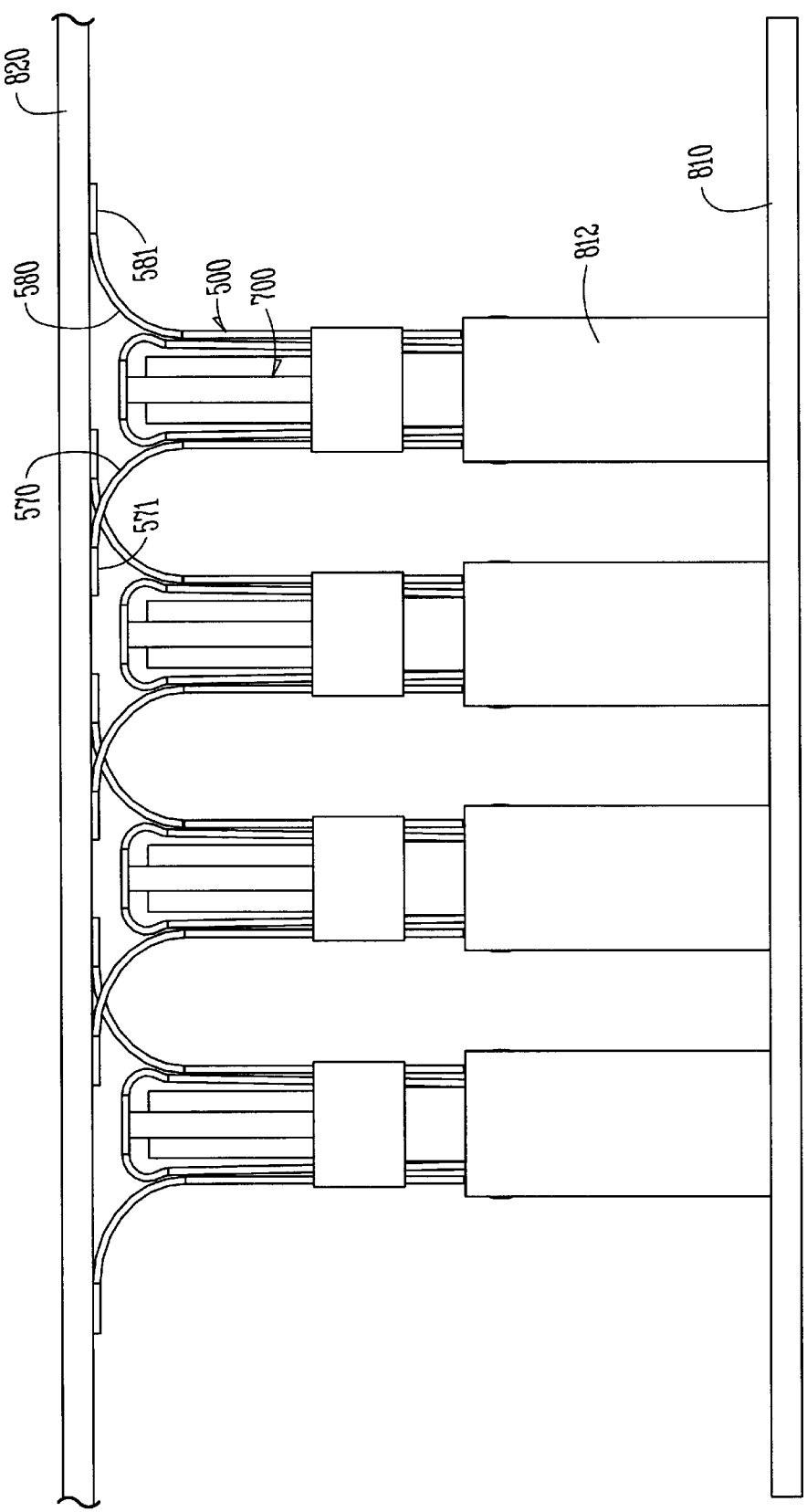

FIG. 12C is an end view of an embodiment of a plurality of heat transfer apparatuses 500 coupled to a plurality of RH-DIMMs 700. The first and second fingers 570, 580 comprise a first and second contact surface 571, 581 adapted to make contact and thermal engagement with a structure 820, such as an enclosure. The first and second fingers 570, 580 comprise a resilient material such that when engaged by a structure, the first and second fingers 570, 580 have a spring bias that urges the first and second contact surface 571, 581 into contact with the structure 820. In this embodiment, a portion of the thermal energy is conducted from the RH-DIMMs 700 to the heat transfer apparatuses 500 and subsequently to the structure 820 via the first and second contact surfaces 571, 581 of the first and second fingers 570, 580. The structure 820 provides a thermal mass that absorbs the thermal energy away from the RH-DIMMs 700.

The urging of the first and second fingers 570, 580 against the structure 820 under spring bias provides other advantages beyond heat transfer properties. For example, among others, contact of the first and second fingers 570, 580 against the structure 820 provides a degree of structural support for the RH-DIMM 700. This is especially important in situations wherein the RH-DIMM 700 experiences vibration and shock. Further, the resiliency of the first and second fingers 570, 580 reduces the need for relatively close tolerances of the distance between the structure 820 and the heat transfer apparatus 500 while ensuring contact between the first and second contact surfaces 571, 581 and the structure 820.

The urging of the first and second side members 510, 520 against the RH-DIMM 700 under spring bias provides other advantages beyond heat transfer properties. For example, among others, contact of the first and second side members 510, 520 against the RH-DIMM 700 provides a degree of structural support for the RH-DIMM 700. This is especially important in situations wherein the RH-DIMM 700 experiences vibration and shock. The first and second side members 510, 520 help to stiffen the RH-DIMM 700 making the RH-DIMM 700 more resistant to shock and vibration.

Referring again to FIGS. 6A–6C, the figures show an embodiment of a heat transfer apparatus 600 coupled to a RH-DIMM 700. The heat transfer apparatus 600 comprises heat transfer members 650 and spring clips 610, 611. The heat transfer members 450 are held against the DRAM chips 704 while the spring clips 610, 611 slidably engage the heat transfer members 450. The spring clips 610, 611 are positioned with respect to the heat transfer members 450 such that the first and second detent portions 622, 642 of the spring clips 610, 611 engage the depressions 652 of the heat transfer members 650. The spring bias of the spring clips 610, 611 secures the heat transfer members 650 to the RH-DIMM 700.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. Heat transfer apparatus comprising:
    a first side member having a first connecting edge and a first free edge opposite the first connecting edge;
    a second side member having a second connecting edge and a second free edge opposite the second connecting edge, wherein at least a portion of the first and second See edges curl outwardly and away from each other forming rolled edges, the rolled edges adapted to engage a tool for spreading apart the first and second side members and wherein the first and second free edges comprise an uncurled portion, the uncurled portions further comprise one or more tabs projecting therefrom, the tabs projecting inwardly towards each other and are adapted to engage a device upon which the apparatus is placed; and
    a connecting member, the connecting member coupled with the first and second side members at the first and second connecting edges, the first and second side members in spaced apart relationship, the first and second side members and the connecting member defining a channel adapted to engage at least one surface of a heat producing device.

2. The apparatus of claim 1, wherein the first and second side members are substantially planar and substantially parallel to each other and the connecting member is substantially perpendicular to the first or second side members.

3. The apparatus of claim 2, wherein the apparatus is resiliently biased such that the first and second side members exert a return force when the first and second free edges are spread apart.

4. The apparatus of claim 3, wherein the rolled edges are adapted to receive spreading jaws of a tool for spreading apart the first and second side members.

5. Heat transfer apparatus comprising:
    a first side member comprising a first inner portion and a first outer portion in substantially parallel and facing relationship to the first inner portion, the first inner and outer portions coupled at a first rolled edge, the first inner portion further comprising a first connecting edge opposite the first rolled edge.
    a second side member comprising a second inner portion and a second connecting edge, the second inner portion having a second rolled edge opposite the second connecting edge, the second rolled edge projecting outwardly and away from the second inner portion, the first and second rolled edges having tool-engaging apertures, the first and second rolled edges adapted to engage a tool for spreading apart the first and second side members; and
    a connecting member coupled with the first and second connecting edges, the first and second inner portions in spaced-apart facing relationship, the first and second inner portions and the connecting member defining a channel adapted to engage at least one surface of a heat producing device.

6. The apparatus of claim 5, wherein the apparatus is resiliently biased such that the first and second side members exert a return force when the first and second side members are spread apart.

7. The apparatus of claim 6, wherein the first and second side members are substantially parallel to each other and the connecting member is substantially perpendicular to the first or second side member.

8. The apparatus of claim 7, wherein the first outer portion comprises a corrugated shape.

9. The apparatus of claim 8, wherein the first outer portion is in contact with the first inner portion.

10. The apparatus of claim 9, wherein the second side member further comprises a second outer portion in substantially parallel and substantially facing relationship with the second inner portion, the second inner and outer portions coupled at the second rolled edge.

11. The apparatus of claim 10, wherein the second outer portion comprises a corrugated shape.

12. The apparatus of claim 11, wherein the second outer portion is in contact with the second inner portion.

13. The apparatus of claim 12, further comprising one or more tabs projecting from the first and second side members adjacent the tool-engaging apertures, the tabs projecting inwardly towards each other to engage a device upon which the apparatus is placed.

14. Heat transfer apparatus comprising:
    a first side member comprising a first inner portion and a first outer portion in substantially parallel and facing relationship to the first inner portion, the first inner and outer portions coupled at a first rolled edge, the first inner portion further comprising a first connecting edge opposite the first rolled edge;
    a second side member comprising a second inner portion and a second connecting edge;
    a connecting member coupled with the first and second connecting edges, the first and second inner portions in spaced-apart facing relationship, the first and second inner portions and the connecting member defining a channel adapted to engage at least one surface of a heat producing device; and one or more first members comprising a substantially planar first side and a second side; and wherein the first outer portion further comprises one or more first arms projecting from a first free edge opposite from the first rolled edge, the one or more first arms projecting in a direction away from the first rolled edge and terminating substantially near the first connecting edge, the one or more first arms in a spaced-apart and substantially parallel relationship with the first inner portion, the one or more first arms adapted to accept and hold the one or more first members such that the first side remains in substantially uniform contact with the first inner portion.

15. The apparatus of claim 14, wherein the apparatus is resiliently biased such that the first and second side members exert a return force when the first and second side members are spread apart.

16. The apparatus of claim 15, wherein the first and second side members are substantially parallel to each other and the connecting member is substantially perpendicular to the first or second side member.

17. The apparatus of claim 16, wherein the one or more first arms provide a spring-biased resilient force when spread apart from the first inner portion to prevent the withdrawal of the one or more first members from between the one or more first arms and the first inner portion.

18. The apparatus of claim 17, wherein the one or more first arms comprise an end portion that curls toward the first inner portion.

19. The apparatus of claim 18 wherein the second side of the first member has additional heat dissipating elements that provide increased surface area on that side.

20. The apparatus of claim 19, wherein the additional heat dissipating elements comprise a plurality of fins.

21. The apparatus of claim 19, wherein the additional heat dissipating elements comprise a plurality of pins.

22. The apparatus of claim 20, wherein the second side further comprises one or more depressions, each depression adapted to couple with one of the one or more arms.

23. The apparatus of claim 22, further comprising tool-engaging apertures in the first and second rolled edges adapted to receive spreading jaws of a tool for spreading apart the first and second side members.

24. The apparatus of claim 23, further comprising one or more tabs projecting from the first and second side members adjacent the tool-engaging apertures, the tabs projecting inwardly towards each other and adapted to engage a device upon which the apparatus is placed.

25. The apparatus of claim 24, wherein the second side member further comprises a second outer portion in substancially parallel and substantially facing relationship with the second inner portion, the second inner and outer portions coupled at the second rolled edge opposite the second connecting edge, wherein the second outer portion further comprises one or more second arms projecting from an edge opposite from the second roled edge, the one or more second arms projecting in a direction away from the second rolled edge and terminating substancially near the second connecting edge, the one or more arms in a spaced-apart and substancially parallel relationship with the second inner portion, the one or more second arms adapted to accept and hold one or more first members such that the first side remains in substancially uniform contact with the second inner portion.

26. Heat transfer apparatus comprising:
a first side member comprising a first inner portion and a first outer portion in substantially parallel and facing relationship to the first inner portion, the first inner and outer portions coupled at a first rolled edge, the first inner portion further comprising a first connecting edge opposite the first rolled edge;

a second side member comprising a second inner portion and a second connecting edge; and a connecting member coupled with the first and second connecting edges, the first and second inner portions in spaced-apart facing relationship, the first and second inner portions and the connecting member defining a channel adapted to engage at least one surface of a heat producing device, wherein the first outer portion comprises one or more first fingers projecting from an edge opposite the first rolled edge, the one or more first fingers projecting in a direction away from the first rolled edge and terminating at or beyond the first connecting edge.

27. The apparatus of claim 26, wherein the apparatus is resiliently biased such that the first and second side members exert a return force when spread apart and the one or more first fingers exert a return force when pressed upon.

28. The apparatus of claim 27, wherein the first and second side members are substantially parallel to each other and the connecting member is substantially perpendicular to the first or second side member.

29. The apparatus of claim 28, wherein the first outer portion is at least in partial contact with the first inner portion, and the second outer portion is at least in partial contact with the second inner portion.

30. The apparatus of claim 29, wherein the second outer portion further comprises one or more second fingers projecting from an edge opposite the second rolled edge, the one or more second fingers projecting in a direction away from the second rolled edge and terminating at or beyond the second connecting edge, wherein the apparatus is resiliently biased such that the one or more second fingers exert a return force when pressed upon.

31. The apparatus of claim 30, wherein the first and second fingers curl outwardly and away from the connecting member.

32. The apparatus of claim 31, wherein the one or more first fingers further comprise a first contact portion, and wherein the one or more second fingers further comprise a second contact portion, the one or more first and second fingers adapted such that the first and second contact portions are substantially coplanar.

33. The apparatus of claim 32, wherein the first and second contact portions lie substantially perpendicular to the first and second side members.

34. The apparatus of claim 33, wherein the contact portions are adapted to substantially contact with spring-biased urging engagement when pressed upon by an adjacent structure.

35. The apparatus of claim 34, wherein the one or more first fingers are in staggered relationship to the one or more second fingers, the staggered relationship substantially prevents contact with adjacent fingers from a second heat transfer apparatus when the heat transfer apparatuses are positioned in side-by-side close proximity to each other.

36. The apparatus of claim 35, further comprising tool-engaging apertures in the first and second rolled edges adapted to receive spreading jaws of a tool for spreading apart the first and second side members.

37. The apparatus of claim 36, further comprising one or more tabs projecting from the first and second side members adjacent the tool-engaging apertures, the tabs projecting inwardly towards each other and adapted to engage a device upon which the apparatus is placed.

38. An electronic component comprising:
a substrate;
one or more heat producing elements coupled to the substrate with opposing surfaces of the elements substantially perpendicular to the surface of the substrate; and
a heat transfer apparatus comprising:
a first side member having a first connecting edge and a first free edge opposite the first connecting edge;
a second side member having a second connecting edge and a second free edge opposite the second connecting edge, wherein at least a portion of the first and second free edges curl outwardly and away from each other forming rolled edges, the rolled edges adapted to engage a tool for spreading apart the first and second side members and wherein the first and second free edges comprise an uncurled portion, the uncurled portions further comprise one or more tabs projecting therefrom, the tabs projecting inwardly towards each other and are adapted to engage a device upon which the apparatus is placed; and
a connecting member, the connecting member coupled with the first and second side members at the first and second connecting edges, the first and second side members in spaced-apart substantially parallel relationship to each other and the connecting member perpendicular to the first or second side members, the first and second side members and the connecting member defining a channel adapted to engage at least one surface of the one or more heat producing elements.

39. The electronic component of 38, wherein the substrate comprises a printed circuit board, the heat transfer apparatus is resiliently biased such that after the first and second side members are spread apart for assembly onto the one or more heat producing elements, the first and second side members return to a flexed position slightly opened beyond the original position so that the first and second side members are in a flexed, pressure applying, removable engagement with the device.

40. An electronic component comprising:
a substrate;
one or more heat producing elements coupled to the substrate with opposing surfaces of the elements substantially perpendicular to the surface of the substrate; and
a heat transfer apparatus comprising:
a first side member comprising a first inner portion and a first outer portion in substantially parallel and substantially facing relationship to each other and coupled at a first rolled edge;
a second side member comprising a second inner portion and a second outer portion in substantially parallel and substantially facing relationship to each other and coupled at a second rolled edge, the first and second rolled edges having tool-engaging apertures, the first and second side members; and
a connecting member coupled with the first and second connecting edges, the first portions and the connecting member defining a channel adapted to engage at least one surface of the one or more heat producing elements.

41. The apparatus of claim 40, wherein the substrate comprises a printed circuit board, the heat transfer apparatus is resiliently biased such that after the first and second side members are spread apart for assembly onto the one or more heat producing elements, the first and second side members return to a flexed position slightly opened beyond the original position so that the first and second side members are in a flexed, pressure applying, removable engagement with the device, the first and second outer portions comprising a corrugated shape.

42. An electronic component comprising:
a substrate;
one or more heat producing elements coupled to the substrate with opposing surfaces of the elements substantially perpendicular to the surface of the substrate; and
a heat transfer apparatus comprising:
a first side member comprising a first inner portion and a first outer portion in substantially parallel and substantially facing relationship to each other and coupled at a first rolled edge, the first inner portion further comprising a first connecting edge opposite the first rolled edge;
a second side member comprising a second inner portion and a second outer portion in substantially parallel and substantially facing relationship to each other and coupled at a second rolled edge, the second inner portion further comprising a second connecting edge opposite the second rolled edge;
a connecting member coupled with the first and second conneccting edges, the first and second inner portions in spaced-apart facing relationship, the first and second inner portions and the connecting member defining a channel adapted to engage at least one surface of the one or more heat producing elements; and one or more first members having a substantially planar first side and a second side, the second side comprising a plurality of fins;
wherein the first and second outer portions of the heat transfer apparatus further comprise one or more first and second arms, respectively, projecting from a first and second free edge, respectively, opposite from the first and second rolled edge, respectively, the one or more first and second arms projecting in a direction away from the first and second rolled edges respectively, and terminating substantially near the first and second connecting edges, respectively, the one or more first and second arms in a spaced-apart and substantially parallel relationship with the first and second inner portions, respectively,
wherein the heat transfer apparatus is resiliently biased such that after the first and second side members are spread apart for assembly onto the one or more heat producing elements, the first and second side members return to a flexed position slightly opened beyond the original position so that the first and second side members are in a flexed, pressure applying, removable engagement with the heat producing elements, and
wherein the heat transfer apparatus is resiliently biased such that after the first and second outer portions are spread apart from the first and second inner portions, respectively, and one or more first members having been placed therebetween with their first side is in substantially uniform contact with the first or second inner portion, the first and second outer portions return to a flexed position slightly opened beyond the original position so that the first and second arms, respectively, are in a flexed, pressure applying, removable engagement with the first member coupling the first side to the first or second inner portion.

43. An electronic component comprising:

a substrate;

one or more heat producing elements coupled to the substrate with opposing surfaces of the elements substantially perpendicular to the surface of the substrate; and a heat transfer apparatus comprising:

a first side member comprising a first inner portion and a first outer portion in substantially parallel and substantially facing relationship to each other and coupled at a first rolled edge, the first inner portion further comprising a first connecting edge opposite the first rolled edge;

a second side member comprising a second inner portion and a second outer portion in substantially parallel and substantially facing relationship to each other and coupled at a second rolled edge, the second inner portion further comprising a second connecting edge opposite the second rolled edge; and a connecting member coupled with the first and second connecting edges, the first and second inner portions in spaced-apart facing relationship, the first and second inner portions and the connecting member defining a channel adapted to engage at least one surface of the one or more heat producing elements, wherein the first and second outer portions comprise one or more first and second fingers projecting from an edge opposite the first and second rolled edge, the one or more first and second fingers projecting in a direction away from the first and second rolled edge and terminating at or beyond the first and second connecting edge, respectively, the heat transfer apparatus is resiliently biased such that after the first and second side members are spread apart for assembly onto the one or more heat producing elements, the first and second side members return to a flexed position slightly opened beyond the original position so that the first and second side members are in a flexed pressure applying, removable engagement with the heat producing elements, and such that the one or more first and second fingers are in a flexed, pressure applying, removable engagement with a secondary structure when pressed upon by the secondary structure.

* * * * *

UNITED STATES PATENT AND TRADEMARK OFFICE
CERTIFICATE OF CORRECTION

PATENT NO. : 6,535,387 B2
DATED : March 18, 2003
INVENTOR(S) : Summers et al.

It is certified that error appears in the above-identified patent and that said Letters Patent is hereby corrected as shown below:

Column 1,
Line 26, delete "assess" and insert -- access --, therefor.

Column 8,
Line 1, delete "FIG." and insert -- FIGS. --, therefor.
Line 37, delete "it" after "which".

Column 9,
Line 25, delete "edge" and insert -- edges --, therefor.

Column 11,
Line 32, delete "discusses" and insert -- discussed --, therefor.

Column 13,
Line 63, delete "comer" and insert -- corner --, therefor.

Column 17,
Line 44, delete "See" and insert -- free --, therefor.
Line 56, delete "spaced apart" and insert -- spaced-apart --, therefor..

Column 18,
Line 10, delete "." and insert -- ; -- after "edge", therefor.

Column 19,
Lines 50, 58, 60 and 63, delete "substancially" and insert -- substantially --, therefor.

Column 21,
Line 33, insert -- claim -- before "38".
Line 52, insert -- , the first inner portion further comprising a first connecting edge opposite the first rolled edge -- after "edge".
Line 56, insert -- , the second inner portion further comprising a second connecting edge opposite the second rolled edge, -- after "edge".

UNITED STATES PATENT AND TRADEMARK OFFICE
CERTIFICATE OF CORRECTION

PATENT NO. : 6,535,387 B2
DATED : March 18, 2003
INVENTOR(S) : Summers et al.

It is certified that error appears in the above-identified patent and that said Letters Patent is hereby corrected as shown below:

<u>Column 21, cont'd,</u>
Line 58, insert -- the first and second rolled edges adapted to engage a tool for spreading apart -- before "the".
Line 60, insert -- the first and second inner portions in spaced-apart facing relationship, -- after "edge".
Line 60, insert -- and second inner -- after "first".

Signed and Sealed this

Fourth Day of May, 2004

JON W. DUDAS
*Acting Director of the United States Patent and Trademark Office*